(12) United States Patent
Kovacic et al.

(10) Patent No.: US 12,316,411 B2
(45) Date of Patent: May 27, 2025

(54) BEAMFORMING COMMUNICATION SYSTEMS WITH HIGH LINEARITY

(71) Applicant: Skyworks Solutions, Inc., Irvine, CA (US)

(72) Inventors: Stephen Joseph Kovacic, Newport Beach, CA (US); Foad Arfaei Malekzadeh, Irvine, CA (US); Mehdi Naseri Ali Abadi, Stittsville (CA); Abdulhadi Ebrahim Abdulhadi, Kanata (CA); Sanjeev Jain, Kanata (CA)

(73) Assignee: Skyworks Solutions, Inc., Irvine, CA (US)

( * ) Notice: Subject to any disclaimer, the term of this patent is extended or adjusted under 35 U.S.C. 154(b) by 169 days.

(21) Appl. No.: 18/301,540

(22) Filed: Apr. 17, 2023

(65) Prior Publication Data

US 2023/0344477 A1 Oct. 26, 2023

Related U.S. Application Data

(60) Provisional application No. 63/363,303, filed on Apr. 20, 2022.

(51) Int. Cl.
*H04B 7/0456* (2017.01)
*H04B 7/06* (2006.01)

(52) U.S. Cl.
CPC ......... *H04B 7/0479* (2023.05); *H04B 7/0617* (2013.01)

(58) Field of Classification Search
CPC ............ H04B 7/0479; H04B 7/0617; H04B 2001/0425; H04B 1/0475; H03F 1/0227; H03F 2200/102; H03F 2200/451; H03F 1/0272; H03F 1/3247; H03F 3/19; H03F 3/245; H03F 3/68
See application file for complete search history.

(56) References Cited

U.S. PATENT DOCUMENTS

| | | | |
|---|---|---|---|
| 6,255,906 B1 | 7/2001 | Eidson et al. | |
| 6,947,711 B1* | 9/2005 | Leyonhjelm | H03F 1/3241 |
| | | | 455/114.3 |
| 10,333,474 B2 | 6/2019 | Alon et al. | |
| 10,879,854 B2 | 12/2020 | Song | |
| 11,038,471 B2 | 6/2021 | Drogi et al. | |
| 11,323,076 B2 | 5/2022 | Song | |
| 11,563,469 B2 | 1/2023 | Brunel et al. | |
| 2021/0273614 A1 | 9/2021 | Drogi et al. | |

(Continued)

*Primary Examiner* — Vineeta S Panwalkar
(74) *Attorney, Agent, or Firm* — Knobbe, Martens, Olson & Bear, LLP

(57) ABSTRACT

Beamforming communication systems with high linearity are provided. In certain embodiments, a method of beamforming includes generating a transmit signal using a baseband processor, providing digital pre-distortion to the transmit signal, generating a radio frequency input signal based on the transmit signal using a transceiver, processing the radio frequency input signal to generate a plurality of radio frequency output signals using a plurality of transmit signal paths of a front end system, providing analog pre-distortion to at least one of the plurality of transmit signal paths using the front end system, and radiating a transmit beam in response to receiving the plurality of radio frequency output signals using an antenna array.

20 Claims, 11 Drawing Sheets

(56) References Cited

U.S. PATENT DOCUMENTS

| | | |
|---|---|---|
| 2022/0302935 A1 | 9/2022 | Drogi |
| 2022/0321063 A1 | 10/2022 | Song |
| 2022/0321156 A1* | 10/2022 | Tonnemacher ......... H04B 1/14 |
| 2022/0385313 A1 | 12/2022 | Drogi |
| 2022/0393708 A1 | 12/2022 | Drogi |
| 2023/0009653 A1* | 1/2023 | Vejlgaard ............... H04B 7/088 |
| 2023/0079623 A1 | 3/2023 | Gebeyehu |
| 2023/0126040 A1 | 4/2023 | Poulin |

* cited by examiner

BEAMFORMING COMMUNICATION SYSTEMS WITH HIGH LINEARITY

CROSS-REFERENCE TO RELATED APPLICATIONS

This application claims the benefit of priority under 35 U.S.C. § 119 of U.S. Provisional Patent Application No. 63/363,303, filed Apr. 20, 2022 and titled "BEAMFORMING COMMUNICATION SYSTEMS WITH HIGH LINEARITY," which is herein incorporated by reference in its entirety.

BACKGROUND

Field

Embodiments of the invention relate to electronic systems, and in particular, to radio frequency (RF) electronics.

Description of Related Technology

A radio frequency (RF) communication system can include a transceiver, a front end, and one or more antennas for wirelessly transmitting and/or receiving signals. The front end can include low noise amplifier(s) for amplifying relatively weak signals received via the antenna(s) and power amplifier(s) for boosting signals for transmission via the antenna(s).

Examples of RF communication systems include, but are not limited to, mobile phones, tablets, base stations, network access points, customer-premises equipment (CPE), laptops, and wearable electronics. RF signals have a frequency in the range from about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a mobile device. The mobile device includes a baseband processor configured to generate a transmit signal, the baseband processor operable to provide digital pre-distortion to the transmit signal. The mobile device further includes a transceiver configured to generate a radio frequency input signal based on the transmit signal, and a front end system including a first transmit signal path configured to process the radio frequency input signal to generate a first radio frequency output signal. The front end system is configured to provide analog pre-distortion to the first transmit signal path. The mobile device further includes a first antenna configured to transmit the first radio frequency output signal.

In some embodiments, the digital pre-distortion is operable to provide a first amount of linearity correction and the analog pre-distortion is operable to provide a second amount of linearity correction. According to a number of embodiments, the first amount of linearity correction is a coarse correction and the second amount of linearity correction is a fine correction.

In several embodiments, the front end system further includes a plurality of transmit signal paths including the first transmit signal path, the plurality of transmit signal paths operable to process the radio frequency input signal to generate a plurality of radio frequency output signals including the first radio frequency output signal.

According to a number of embodiments, the baseband processor is further configured to generate settings for digital pre-distortion based on observation data that is generated based on observations from two or more observation paths corresponding to two or more of the plurality of transmit signal paths. In accordance with various embodiments, the observation data is generated based on an average of observations from the two or more observation paths. According to some embodiments, the front end system includes two or more directional couplers each coupled to a corresponding one of the two or more observation paths, and a multiplexer configured to select one of the two or more directional couplers.

According to various embodiments, the front end system is configured to provide analog pre-distortion to each of the plurality of transmit signal paths. In accordance with a number of embodiments, the analog pre-distortion is operable to compensate for differences in distortion responses amongst the plurality of transmit signal paths, the differences in distortion responses including at least one of phase distortion or gain distortion. According to some embodiments, an amount of analog pre-distortion provided to each of the plurality of transmit signal paths is separately controlled. In accordance with various embodiments, the front end system includes a memory storing a codebook, the amount of analog pre-distortion provided to each of the plurality of transmit signal paths based on pre-distortion data stored in the codebook. According to a number of embodiments, the mobile device further includes an antenna array configured to radiate a transmit beam in response to receiving the plurality of radio frequency output signals, the cookbook further including beam configuration data indicating parameters for a plurality of different transmit beams. In accordance with several embodiments, the amount of analog pre-distortion provided to each of the plurality of transmit signal paths is unique.

According to various embodiments, the front end system includes a splitter configured to split the radio frequency input signal into a plurality of radio frequency input signals each provided to a corresponding one of the plurality of transmit signal paths.

In accordance with a number of embodiments, the front end system includes a plurality of power amplifiers each operating in a respective one of the plurality of transmit signal paths, the front end system configured to provide analog pre-distortion based on adjusting a bias of at least one of the plurality of power amplifiers.

According to some embodiments, the front end system includes a plurality of power amplifiers each operating in a respective one of the plurality of transmit signal paths, the front end system configured to provide analog pre-distortion based on adjusting a supply voltage of at least one of the plurality of power amplifiers.

According to a number of embodiments, the front end system includes a plurality of phase shifters each operating in a respective one of the plurality of transmit signal paths, the front end system configured to provide analog pre-distortion based on adjusting a phase shift provided by at least one of the plurality of phase shifters.

In accordance with various embodiments, the front end system includes a plurality of variable gain amplifiers each operating in a respective one of the plurality of transmit signal paths, the front end system configured to provide analog pre-distortion based on adjusting a gain provided by at least one of the plurality of variable gain amplifiers.

In certain embodiments, the present disclosure relates to a method of beamforming with high linearity. The method includes generating a transmit signal using a baseband processor, including providing digital pre-distortion to the transmit signal. The method further includes generating a radio frequency input signal based on the transmit signal using a transceiver. The method further includes processing the radio frequency input signal to generate a first radio frequency output signal using a first transmit signal path of a front end system, providing analog pre-distortion to the first transmit signal path using the front end system, and transmitting the first radio frequency output signal using a first antenna.

In certain embodiments, the present disclosure relates to a radio frequency module for a mobile device. The radio frequency module includes a module substrate, a baseband processor attached to the module substrate and configured to generate a transmit signal with digital pre-distortion, a transceiver attached to the module substrate and configured to generate a radio frequency input signal based on the transmit signal, and a first transmit signal path operable to process the radio frequency input signal to generate a first radio frequency output signal. The first transmit signal path is operable to provide analog pre-distortion to the radio frequency input signal.

In certain embodiments, the present disclosure relates to a beamforming communication system. The beamforming communication system includes a baseband processor configured to generate a transmit signal, the baseband processor operable to provide digital pre-distortion to the transmit signal, a transceiver configured to generate a radio frequency input signal based on the transmit signal, a front end system including a plurality of transmit signal paths operable to process the radio frequency input signal to generate a plurality of radio frequency output signals, the front end system configured to provide analog pre-distortion to at least one of the plurality of transmit signal paths, and an antenna array configured to radiate a transmit beam in response to receiving the plurality of radio frequency output signals.

In various embodiments, the digital pre-distortion is operable to provide a first amount of linearity correction and the analog pre-distortion is operable to provide a second amount of linearity correction. According to a number of embodiments, the first amount of linearity correction is a coarse correction and the second amount of linearity correction is a fine correction.

In several embodiments, the baseband processor is further configured to generate settings for digital pre-distortion based on observation data.

According to a number of embodiments, the observation data is generated based on observations from two or more observation paths corresponding to two or more of the plurality of transmit signal paths. In accordance with some embodiments, the observation data is generated based on an average of observations from the two or more observation paths. According to various embodiments, the front end system includes two or more directional couplers each coupled to a corresponding one of the two or more observation paths, and a multiplexer configured to select one of the two or more directional couplers.

In accordance with a number of embodiments, the observation data is further used to generate settings for the analog pre-distortion provided in the front end system. According to some embodiments, the baseband processor is configured to generate digital pre-distortion settings for each of the plurality of transmit signal paths based on corresponding observations from each of the plurality of transmit signal paths, and to generate analog pre-distortion settings for each of the plurality of transmit signal paths based on processing the digital pre-distortion settings.

In accordance with various embodiments, the observation data is generated based on observations from an observation path corresponding to one of the plurality of transmit signal paths. According to a number of embodiments, the digital distortion compensates the observation path, and the front end system does not provide analog pre-distortion to the observation path. In accordance with several embodiments, the digital pre-distortion is operable to provide a coarse linearity correction to the at least one of the plurality of transmit signal paths, and the analog pre-distortion is operable to provide a fine linearity correction to the at least one of the plurality of transmit signal paths.

In some embodiments, the front end system is configured to provide analog pre-distortion to each of the plurality of transmit signal paths. According to a number of embodiments, the analog pre-distortion is operable to reduce an error vector magnitude of the beamforming communication system. In accordance with various embodiments, the analog pre-distortion is operable to compensate for differences in distortion responses amongst the plurality of transmit signal paths. According to several embodiments, the differences in distortion responses include at least one of phase distortion (AM-PM) or gain distortion (AM-AM). In accordance with a number of embodiments, an amount of analog pre-distortion provided to each of the plurality of transmit signal paths is separately controlled. According to various embodiments, the front end system includes a memory storing a codebook, the amount of analog pre-distortion provided to each of the plurality of transmit signal paths based on pre-distortion data stored in the codebook. In accordance with several embodiments, the cookbook further includes beam configuration data indicating parameters for a plurality of different transmit beams. According to a number of embodiments, the amount of analog pre-distortion provided to each of the plurality of transmit signal paths is unique.

In various embodiments, the front end system includes a splitter configured to split the radio frequency input signal into a plurality of radio frequency input signals each thereof provided to a corresponding one of the plurality of transmit signal paths.

In several embodiments, the front end system receives a control signal for analog pre-distortion from the transceiver. According to a number of embodiments, the transceiver receives a digital instruction for analog pre-distortion from the baseband processor.

In some embodiments, the front end system includes a plurality of power amplifiers each operating in a respective one of the plurality of transmit signal paths, the front end system configured to provide analog pre-distortion based on adjusting a bias of at least one of the plurality of power amplifiers.

In various embodiments, the front end system includes a plurality of power amplifiers each operating in a respective one of the plurality of transmit signal paths, the front end system configured to provide analog pre-distortion based on adjusting a supply voltage of at least one of the plurality of power amplifiers.

In some embodiments, the front end system includes a plurality of phase shifters each operating in a respective one of the plurality of transmit signal paths, the front end system configured to provide analog pre-distortion based on adjusting a phase shift provided by at least one of the plurality of phase shifters.

In various embodiments, the front end system includes a plurality of variable gain amplifiers each operating in a respective one of the plurality of transmit signal paths, the front end system configured to provide analog pre-distortion based on adjusting a gain provided by at least one of the plurality of variable gain amplifiers.

In several embodiments, the beamforming communication system further includes at least one observation loop from the front end system to the baseband processor. According to a number of embodiments, the observation loop is operable to train the digital pre-distortion that is provided to the transmit signal.

In some embodiments, the beamforming communication system is implemented in user equipment for a cellular network.

In certain embodiments, the present disclosure relates to a method of beamforming with high linearity. The method includes generating a transmit signal using a baseband processor, including providing digital pre-distortion to the transmit signal, generating a radio frequency input signal based on the transmit signal using a transceiver, processing the radio frequency input signal to generate a plurality of radio frequency output signals using a plurality of transmit signal paths of a front end system, providing analog pre-distortion to at least one of the plurality of transmit signal paths using the front end system, and radiating a transmit beam in response to receiving the plurality of radio frequency output signals using an antenna array.

In various embodiments, the method further includes providing a first amount of linearity correction using the digital pre-distortion and providing a second amount of linearity correction using the analog pre-distortion. According to a number of embodiments, the first amount of linearity correction is a coarse correction and the second amount of linearity correction is a fine correction.

In several embodiments, the method further includes generating settings for digital pre-distortion based on observation data using the baseband processor.

According to a number of embodiments, the method further includes obtaining the observation data from observations of two or more observation paths corresponding to two or more of the plurality of transmit signal paths. In accordance with various embodiments, the method further includes averaging the observations from the two or more observation paths. According to some embodiments, further includes multiplexing the two or more observation paths.

In accordance with a number of embodiments, the method further includes processing the observation data to generate settings for the analog pre-distortion provided by the front end system. According to various embodiments, the method further includes processing the observation data further includes generating digital pre-distortion settings for each of the plurality of transmit signal paths based on corresponding observations from each of the plurality of transmit signal paths, and generating analog pre-distortion settings for each of the plurality of transmit signal paths based on processing the digital pre-distortion settings.

In accordance with various embodiments, the method further includes obtaining the observation data from an observation path corresponding to one of the plurality of transmit signal paths. According to several embodiments, the method further includes using the digital pre-distortion to compensate the observation path without providing analog pre-distortion to the observation path. In accordance with a number of embodiments, the method further includes using the digital pre-distortion to provide a coarse linearity correction to the at least one of the plurality of transmit signal paths, and using the analog pre-distortion to provide a fine linearity correction to the at least one of the plurality of transmit signal paths.

In some embodiments, the method further includes providing analog pre-distortion to each of the plurality of transmit signal paths. According to a number of embodiments, the method further includes providing analog pre-distortion includes reducing an error vector magnitude in a signal constellation. In accordance with several embodiments, the method further includes using analog pre-distortion to compensate for differences in distortion responses amongst the plurality of transmit signal paths. According to various embodiments, the differences in distortion responses include at least one of phase distortion (AM-PM) or gain distortion (AM-AM). In accordance with a number of embodiments, the method further includes separately controlling an amount of analog pre-distortion provided to each of the plurality of transmit signal paths. According to a several embodiments, the method further includes selecting the amount of analog pre-distortion provided to each of the plurality of transmit signal paths based on pre-distortion data stored in a codebook. In accordance with various embodiments, the method further includes obtaining beam configuration data indicating parameters for a plurality of different transmit beams from the codebook. According to a number of embodiments, the method further includes providing a unique amount of analog pre-distortion to each of the plurality of transmit signal paths.

In various embodiments, the method further includes splitting the radio frequency input signal into a plurality of radio frequency input signals using a splitter, and providing each of the plurality of radio frequency input signals to a corresponding one of the plurality of transmit signal paths.

In several embodiments, the method further includes providing a control signal for analog pre-distortion from the transceiver to the front end system. According to a number of embodiments, the method further includes providing a digital instruction for analog pre-distortion from the baseband processor to the transceiver.

In a number of embodiments, providing analog pre-distortion includes adjusting a bias of at least one power amplifier.

In some embodiments, providing analog pre-distortion includes adjusting a voltage level of a supply voltage of at least one power amplifier.

In various embodiments, providing analog pre-distortion includes adjusting a phase shift provided by at least one phase shifter.

In several embodiments, providing analog pre-distortion includes adjusting a gain provided by at least one variable gain amplifier.

In some embodiments, the method further includes providing observation data from the front end system to the baseband processor by way of at least one observation loop. According to a number of embodiments, the method further includes using the observation data to train the digital pre-distortion. In accordance with several embodiments, the method further includes multiplexing two or more of the plurality of transmit signal paths.

In certain embodiments, the present disclosure relates to a radio frequency module for a beamforming communication system. The radio frequency module includes a module substrate, a baseband processor attached to the module substrate and configured to generate a transmit signal with digital pre-distortion, a transceiver attached to the module substrate and configured to generate a radio frequency input signal based on the transmit signal, and a plurality of transmit signal paths operable to process the radio frequency input signal to generate a plurality of radio frequency output signals, at least one of the plurality of transmit signal paths operable to provide analog pre-distortion to the radio frequency input signal.

In various embodiments, the digital pre-distortion is operable to provide a first amount of linearity correction and the analog pre-distortion is operable to provide a second amount of linearity correction. According to a number of embodiments, the first amount of linearity correction is a coarse correction and the second amount of linearity correction is a fine correction.

In several embodiments, the baseband processor is further configured to generate settings for digital pre-distortion based on observation data.

According to a number of embodiments, the observation data is generated based on observations from two or more observation paths corresponding to two or more of the plurality of transmit signal paths. In accordance with various embodiments, the observation data is generated based on an average of observations from the two or more observation paths. According to some embodiments, the radio frequency module further includes two or more directional couplers each coupled to a corresponding one of the two or more observation paths, and a multiplexer configured to select one of the two or more directional couplers.

In accordance with a number of embodiments, the observation data is further used to generate settings for the analog pre-distortion. According to various embodiments, the baseband processor is configured to generate digital pre-distortion settings for each of the plurality of transmit signal paths based on corresponding observations from each of the plurality of transmit signal paths, and to generate analog pre-distortion settings for each of the plurality of transmit signal paths based on processing the digital pre-distortion settings.

In accordance with some embodiments, the observation data is generated based on observations from an observation path corresponding to one of the plurality of transmit signal paths. According to several embodiments, the digital pre-distortion compensates the observation path without any analog pre-distortion applied to the observation path. In accordance with a number of embodiments, the digital pre-distortion is operable to provide a coarse linearity correction to the at least one of the plurality of transmit signal paths, and the analog pre-distortion is operable to provide a fine linearity correction to the at least one of the plurality of transmit signal paths.

In some embodiments, the plurality of transmit signal paths are each configured to provide analog pre-distortion to the radio frequency input signal. According to various embodiments, the analog pre-distortion is operable to reduce an error vector magnitude of the radio frequency module. In accordance with a number of embodiments, the analog pre-distortion is operable to compensate for differences in distortion responses amongst the plurality of transmit signal paths. According to several embodiments, the differences in distortion responses include at least one of phase distortion (AM-PM) or gain distortion (AM-AM). In accordance with various embodiments, an amount of analog pre-distortion provided to each of the plurality of transmit signal paths is separately controlled. According to a number of embodiments, the radio frequency module further includes a memory storing a codebook, the amount of analog pre-distortion provided to each of the plurality of transmit signal paths based on pre-distortion data stored in the codebook. In accordance with several embodiments, the cookbook further includes beam configuration data indicating parameters for a plurality of different transmit beams. According to various embodiments, the amount of analog pre-distortion provided to each of the plurality of transmit signal paths is unique.

In several embodiments, the radio frequency module further includes a splitter configured to split the radio frequency input signal into a plurality of radio frequency input signals each thereof provided to a corresponding one of the plurality of transmit signal paths.

In a number of embodiments, the plurality of transmit signal paths include a plurality of power amplifiers each operating in a respective one of the plurality of transmit signal paths, the analog pre-distortion provided based on an adjustment to a bias of at least one of the plurality of power amplifiers.

In various embodiments, the plurality of transmit signal paths include a plurality of power amplifiers each operating in a respective one of the plurality of transmit signal paths, the analog pre-distortion provided based on an adjustment to a supply voltage of at least one of the plurality of power amplifiers.

In some embodiments, the plurality of transmit signal paths include a plurality of phase shifters each operating in a respective one of the plurality of transmit signal paths, the analog pre-distortion provided based on an adjustment to a phase shift provided by at least one of the plurality of phase shifters.

In several embodiments, the plurality of transmit signal paths include a plurality of variable gain amplifiers each operating in a respective one of the plurality of transmit signal paths, the analog pre-distortion provided based on an adjustment to a gain provided by at least one of the plurality of variable gain amplifiers.

In various embodiments, the radio frequency module further includes at least one observation loop from the plurality of transmit signal paths to the baseband processor. According to a number of embodiments, the observation loop is operable to train the digital pre-distortion that is provided to the transmit signal.

In several embodiments, the radio frequency module further includes an antenna array configured to radiate a transmit beam in response to receiving the plurality of radio frequency output signals.

In a number of embodiments, the baseband processor and the transceiver are formed on a common semiconductor die.

In some embodiments, the baseband processor and the transceiver are formed on separate semiconductor dies.

In certain embodiments, the present disclosure relates to a front end system. The front end system includes a splitter configured to split a digitally pre-distorted radio frequency signal into a plurality of radio frequency input signals, a plurality of transmit signal conditioning circuits configured to process the plurality of radio frequency input signals to generate a plurality of radio frequency output signals for an antenna array, and at least one analog pre-distortion circuit configured to provide analog pre-distortion to at least one of the plurality of transmit signal conditioning circuits.

In some embodiments, the at least one analog pre-distortion circuit includes a plurality of analog pre-distortion circuits each configured to provide analog pre-distortion to a corresponding one of the plurality of transmit signal conditioning circuits.

According to a number of embodiments, the plurality of analog pre-distortion circuits are operable to compensate for differences in distortion responses amongst the plurality of transmit signal conditioning circuits. In accordance with several embodiments, the differences in distortion responses include at least one of phase distortion (AM-PM) or gain distortion (AM-AM).

According to various embodiments, the analog pre-distortion is operable to reduce an error vector magnitude in a signal constellation of the front end system.

In accordance with a number of embodiments, an amount of analog pre-distortion provided to each of the plurality of transmit signal conditioning circuits is separately controlled. According to several embodiments, the front end system further includes a memory storing a codebook, the amount of analog pre-distortion provided to each of the plurality of transmit signal conditioning circuits based on pre-distortion data stored in the codebook. In accordance with various embodiments, the cookbook further includes beam configuration data indicating parameters for a plurality of different transmit beams. According to various embodiments, the amount of analog pre-distortion provided to each of the plurality of transmit signal conditioning circuits is unique.

In some embodiments, the front end system is implemented on a semiconductor die.

In several embodiments, the front end system is implemented on a packaged module.

In various embodiments, the front end system receives a control signal for analog pre-distortion.

In a number of embodiments, the plurality of transmit signal conditioning circuits include a plurality of power amplifiers, the at least one analog pre-distortion circuit configured to provide analog pre-distortion based on adjusting a bias of at least one of the plurality of power amplifiers.

In several embodiments, the plurality of transmit signal conditioning circuits include a plurality of power amplifiers, the at least one analog pre-distortion circuit configured to provide analog pre-distortion based on adjusting a supply voltage of at least one of the plurality of power amplifiers.

In various embodiments, the plurality of transmit signal conditioning circuits include a plurality of phase shifters, and the at least one analog pre-distortion circuit configured to provide analog pre-distortion based on adjusting a phase shift provided by at least one of the plurality of phase shifters.

In a number of embodiments, the plurality of transmit signal conditioning circuits include a plurality of variable gain amplifiers, the at least one analog pre-distortion circuit configured to provide analog pre-distortion based on adjusting a gain provided by at least one of the plurality of variable gain amplifiers.

In various embodiments, the front end system further includes at least one observation circuit coupled to one or more of the transmit signal conditioning circuits. According to several embodiments, the at least one observation circuit includes one or more directional couplers.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
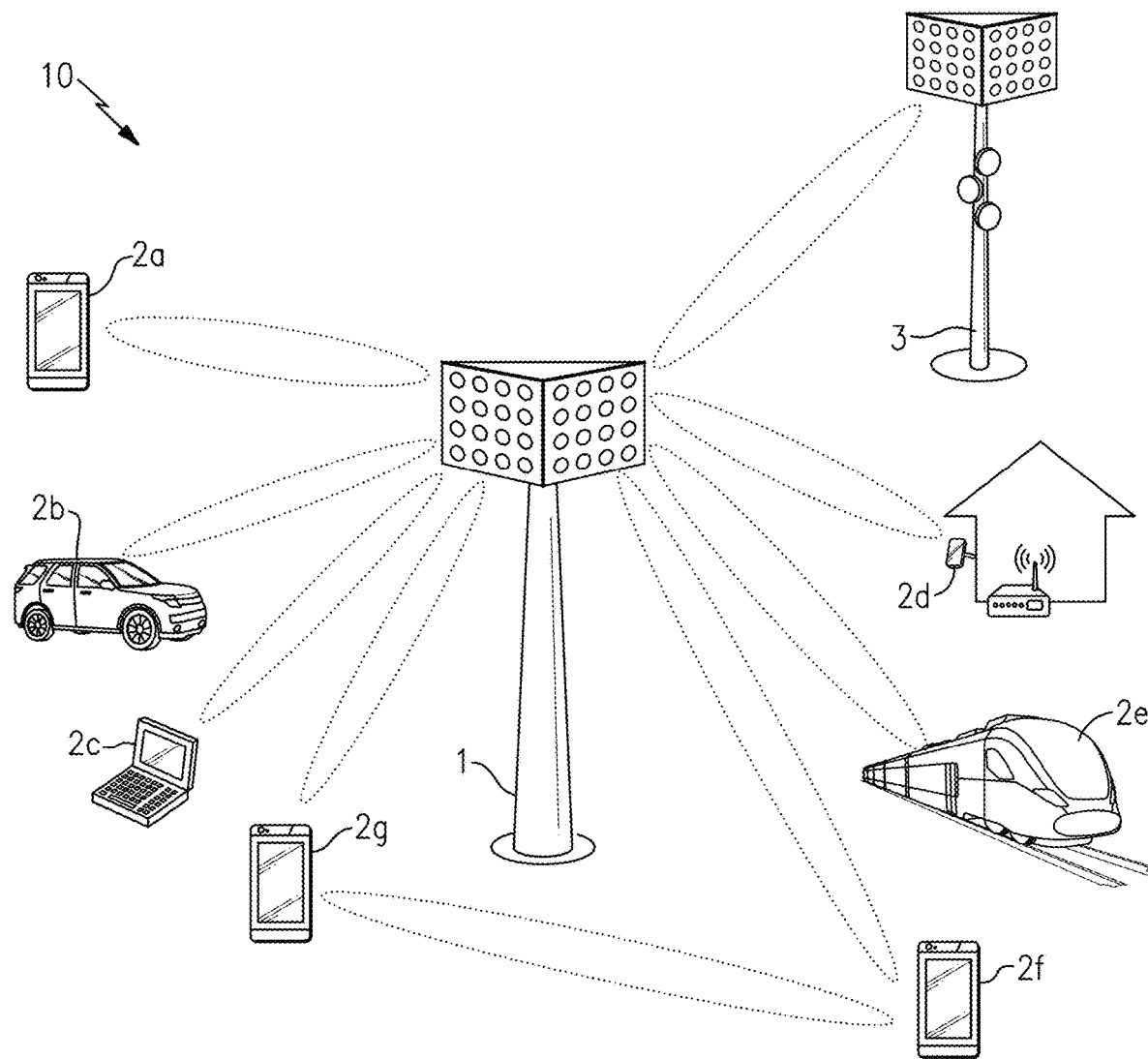
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 20.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
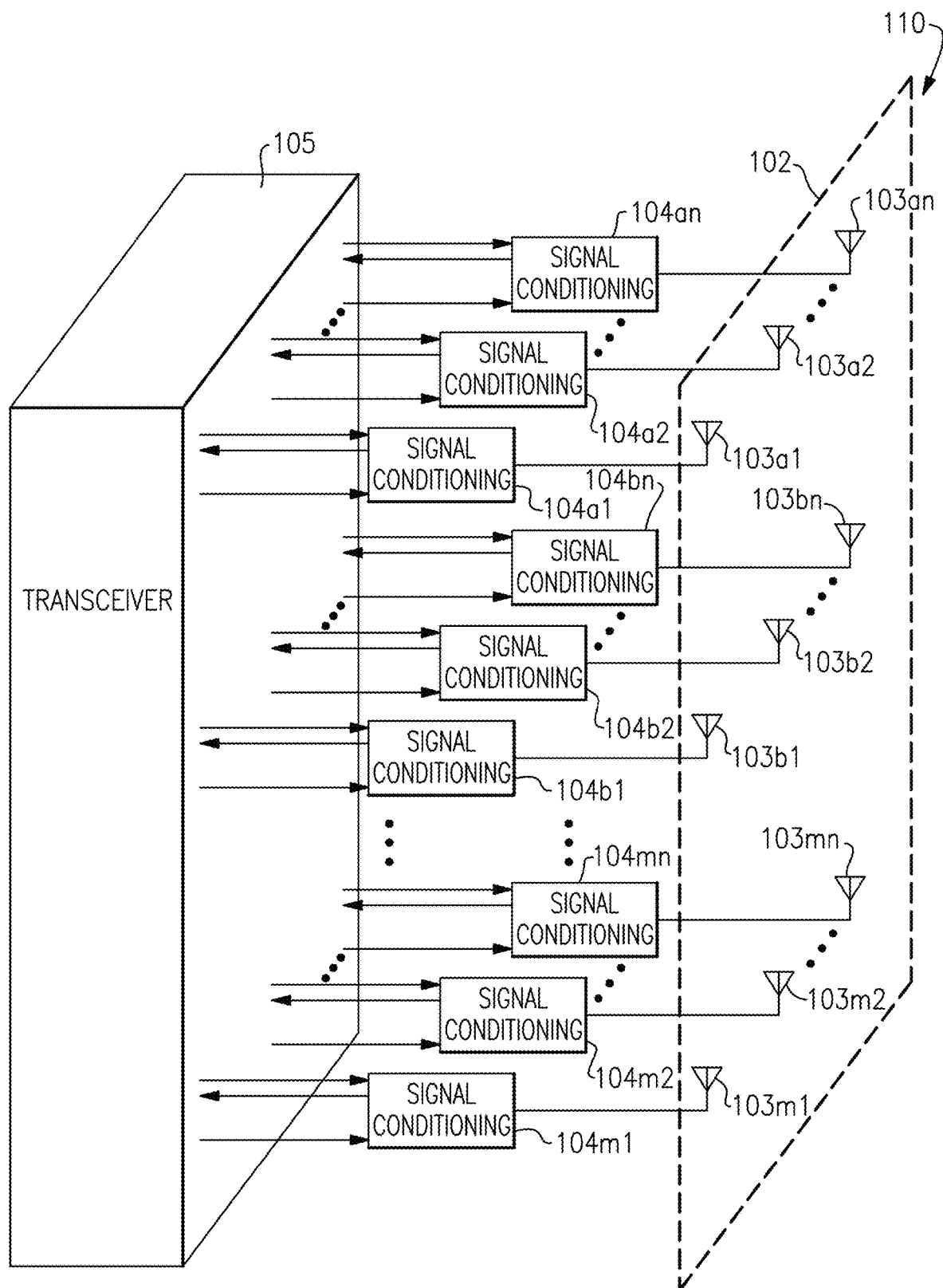
FIG. 2A is a schematic diagram of one example of a communication system that operates with beamforming.

FIG. 2A is a schematic diagram of one example of a communication system 110 that operates with beamforming. The communication system 110 includes a transceiver 105, signal conditioning circuits 104a1, 104a2 104an, 104b1, 104b2 . . . 104bn, 104m1, 104m2 104mn, and an antenna array 102 that includes antenna elements 103a1, 103a2 103an, 103b1, 103b2 . . . 103bn, 103m1, 103m2 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 2A, the transceiver 105 generates control signals for the signal conditioning circuits. The control signals can be used for a variety of functions, such as controlling the gain and phase of transmitted and/or received signals to control beamforming.

Figure 2B:
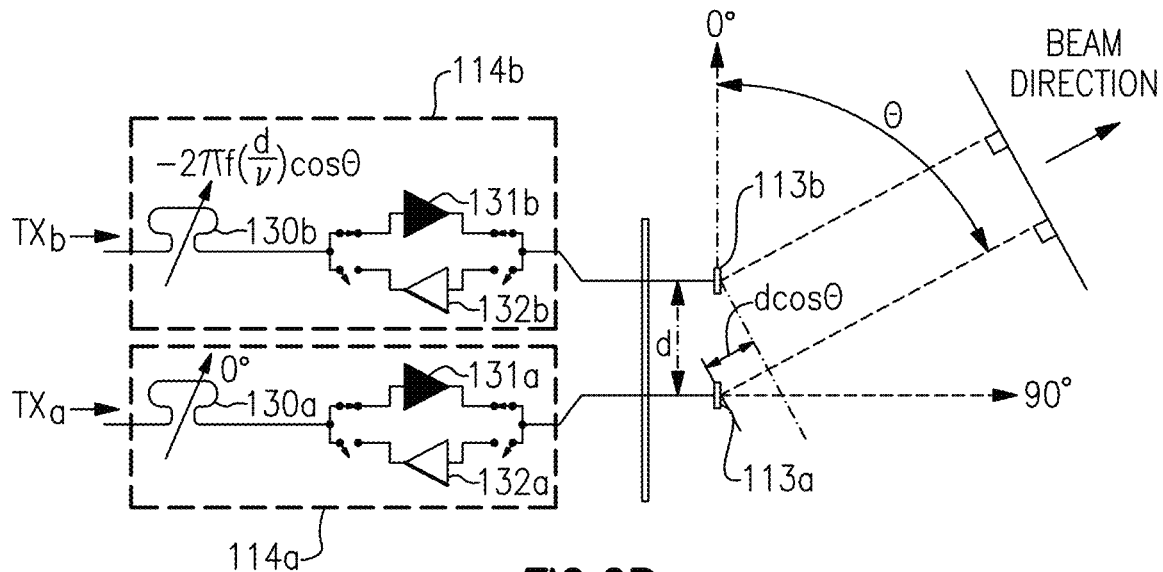
FIG. 2B is a schematic diagram of one example of beamforming to provide a transmit beam.

FIG. 2B is a schematic diagram of one example of beamforming to provide a transmit beam. FIG. 2B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 2B illustrates one embodiment of a portion of the communication system 110 of FIG. 2A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 2B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about −πcos θ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 2A) controls phase values of one or more phase shifters and gain values of one or more controllable amplifiers to control beamforming.

Figure 2C:
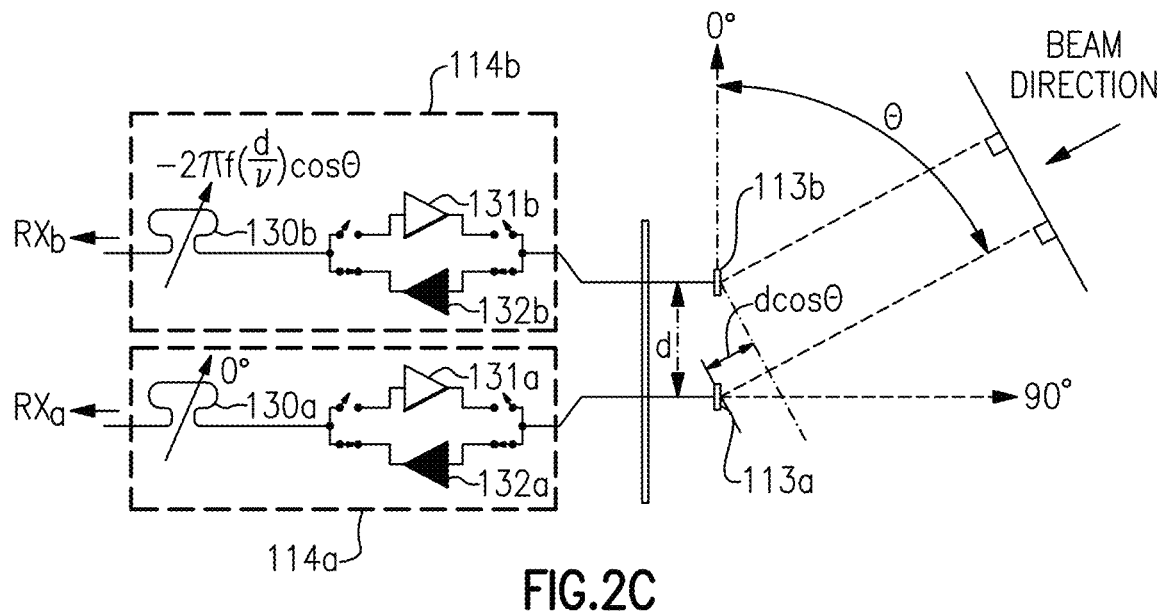
FIG. 2C is a schematic diagram of one example of beamforming to provide a receive beam.

FIG. 2C is a schematic diagram of one example of beamforming to provide a receive beam. FIG. 2C is similar to FIG. 2B, except that FIG. 2C illustrates beamforming in the context of a receive beam rather than a transmit beam.

As shown in FIG. 2C, a relative phase difference between the first phase shifter 130a and the second phase shifter 130b can be selected to about equal to −2πf(d/v)cos θ radians to achieve a desired receive beam angle θ. In implementations in which the distance d corresponds to about ½λ, the phase difference can be selected to about equal to −πcos θ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Beamforming Communication Systems with High Linearity

Digital pre-distortion (DPD) can be used to linearize a signal that is being transmitted by a communication system by way of a transmit signal path. For example, nonlinearity from a power amplifier and/or other components along the transmit signal path can lead to in-band distortion, which can be quantified by error vector magnitude (EVM). For instance, EVM is a direct measurement of modulation accuracy and transmitter performance that captures an error vector between a measured signal and its corresponding ideal point in a signal constellation, such as a 16 quadrature amplitude modulation (QAM) constellation.

Using DPD can provide a flexible and robust mechanism for enhancing performance of a wide variety of communication systems, including modern ultra-wideband communication systems.

DPD operates in the digital domain (for instance, by digital processing in a baseband processor) to construct a pre-distortion that is imposed on digital transmit data representing an RF signal that is being transmitted. The digital transmit data can be, for example, digital in-phase (I) and quadrature-phase (Q) signals that are subsequently converted to analog I and Q signals and modulated using an I/Q modulator to generate the RF signal for transmission. The pre-distortion provided by the DPD is anticipated to compensate for distortion arising from the power amplifier and/or other components along the transmit signal path.

By using DPD, the power amplifier and/or other components along the transmit signal path can operate in a normally less linear regime, thereby leading to enhancements in efficiency. For example, using DPD can lead to an enhancement in a figure of merit of the power amplifier, for instance, power added efficiency (PAE) and/or other measurements of the trade-off between amplifier linearity and efficiency.

In one example, a power amplifier can be designed with a bias circuit that biases the power amplifier in Class AB operation, anticipating that DPD will correct for the non-linearity that will be imposed on the RF signal. In contrast, without the benefit of DPD, system linearity constraints may demand that the power amplifier is biased in the more linear Class A operation, which is less efficient than Class AB operation.

Moreover, even in the context of a power amplifier biased in Class A operation, at some point, the RF signal provided by the power amplifier will be distorted as output signal power approaches the power amplifier's saturated output power (PSAT). Thus, the system designer may choose to operate the power amplifier backed-off from PSAT (for instance, at a 1 dB compression point or P1 dB) when high linearity amplification is desired.

However, the degree of back-off chosen influences the linearity of the power amplifier's RF output signal given an RF input signal with a maximum peak to average power ratio (PAPR). For example, to produce 20 dBm of linear (average) output power from a power amplifier amplifying a 64 QAM orthogonal frequency-division multiplexing (OFDM) signal having a PAPR of about 10 dB, the RF system designer may choose to size the power amplifier to be able to have 30 dBm PSAT. In other words, for 100 mW of average power leaving the power amplifier, the power amplifier consumes DC power sufficient to provide about 1 W output power at saturation.

As skilled artisans will appreciate, such a backed-off condition leads to inefficient operation of the power amplifier. In this context, being able to operate the power amplifier closer to PSAT or P1 dB using DPD to compensate for the anticipated power amplifier compression (reducing gain) is a benefit insofar as the power consumed by DPD is small compared to the overall efficiency improvement of the power amplifier.

Analog pre-distortion (APD) is another technique that can be used to linearize the output of an RF amplifier, such as a power amplifier. In contrast to DPD, APD pre-distorts the RF signal in the analog domain by imposing changes to the RF input signal presented to the amplifier. Moreover, certain APD techniques leverage intrinsic non-linearity of another semiconductor device (for instance, a diode) that is placed in parallel or in-line with the transmit signal path to the amplifier.

To determine changes to the RF signal leading to linearity improvement, both APD and DPD corrections can be based on observations from an observation loop. For example, such an observation loop can be used to examine or compare the RF output signal from the amplifier to an input signal to thereby determine what linearity correction is desired. For example, dynamic, periodic, and/or static observations of the RF output signal can be used. Thus, while some communication systems operate with constant feedback (dynamic observation) for determining how to pre-distort the RF input signal for linearity enhancement, other communication systems operate with intermittent feedback.

Communication systems that utilize millimeter wave carriers (for instance, 30 GHz to 300 GHz), centimeter wave carriers (for instance, 3 GHz to 30 GHz), and/or other carrier frequencies can employ an antenna array to provide beam formation and directivity for transmission and/or reception of signals. Such communication systems are referred to as beamforming communication systems or phased array antenna systems.

For example, in the context of signal transmission, an antenna array of m×n antennas can radiate signals with separately controllable amplitude and phase. Additionally, the signals from the antennas combine using constructive and destructive interference to generate an aggregate transmit signal exhibiting beam-like qualities with more signal strength propagating in a given direction away from the antenna array. In the context of signal reception, more signal energy is received by the antenna array when the signal is arriving from a particular direction. Accordingly, an antenna array can also provide directivity for reception of signals.

The relative concentration of signal energy into a beam can be enhanced by increasing the size of the array, up to a limit. For example, with more signal energy focused into a transmitted beam, the signal is able to propagate for a longer range while providing sufficient signal level for wireless communications. For instance, a signal with a large proportion of signal energy focused into the transmitted beam can exhibit high effective isotropic radiated power (EIRP).

A number of challenges arise when using DPD and/or APD techniques in a beamforming communication system. For example, the inventors of the present disclosure have recognized that each transmit signal path to an antenna array can include a power amplifier and/or other non-linear components for which a unique pre-distortion correction is desired for linearity enhancement. For example, even when each power amplifier has a substantially identical implementation (for instance, power amplifiers fabricated on a common semiconductor die or on two or more semiconductor dies having the same part number/design), parametric variation amongst the power amplifiers can lead to a high probability that each antenna is transmitting into a different load, which is dependent upon beam parameters.

The teachings herein can be used to provide efficient implementation of pre-distortion techniques in the context of beamforming communication systems. For example, both DPD and APD techniques can be provided concurrently to a beamforming communication system to provide linearity enhancement.

In some implementations, DPD is used to pre-distort an RF signal to improve linearity, while APD is provided to one or more transmit signal paths to the antenna array to further enhance linearity. In one approach, DPD, APD, or both are applied concurrently to one transmit signal path of the beamforming communication system with the assumption that such correction provides sufficient linearity correction for the remaining transmit signal paths over each desired power level and beam configuration. In another approach, DPD is used to pre-distort an RF signal that is provided to each transmit signal path to the antenna array, with separate APD corrections provided to at least a portion of the transmit signal paths.

In certain implementations, DPD is used to provide coarse linearity correction to an RF signal that is propagating along a transmit signal path coupled to one or more observation loops, such as dynamic, static, and/or periodic loops. Additionally, APD circuitry integrated with each transmit signal path (for instance, integrated with each power amplifier) is used for fine linearity correction. For example, fine-tuned magnitude adjustments and/or fined-tuned phase adjustments can be provided on each transmit signal path to provide pre-distortion in the analog domain.

Accordingly, differences present between transmit signal paths of a beamforming communication systems can be compensated using APD that is separately controllable (for instance, unique) to each transmit signal path. For example, slight differences in amplitude distortion (AM-AM) and/or phase distortion (AM-PM) responses of the transmit signal paths can be compensated for by using APD unique to each path. In another example, the APD provided by each path reduces EVM in a signal constellation.

In certain implementations, APD parameters for providing an appropriate APD correction for each transmit signal path are determined by at least one of observation or pre-determined data. For instance, pre-determined data can be generated by testing prior to usage of the transmit signal path in the context of normal beam transmission. In one example, transmit signal path testing is performed at final die testing after manufacture.

For instance, for a semiconductor die with multiple independent transmit signal paths (for instance, 8) each having at least one power amplifier (for instance, a 28 GHz power amplifier), each transmit signal path can be exercised independently to measure AM-AM and AM-PM responses over a variety of operating conditions, including, but not limited to, load and/or power. Additionally, each response can be compared to generate or set APD parameters for a memory (for instance, a non-volatile memory of the die). When operating with the APD parameters, the AM-AM response and/or AM-PM response of each of the transmit signal paths can be substantially identical. Thus, the APD parameters operate to reduce or eliminate differences in AM-AM and/or AM-PM responses, in this example.

Although one example of generating APD parameters has been described above, a wide range of techniques and/or methods can be used to determine APD parameters. For instance, in another example, holistic testing is used in which one or more transmit beams are formed and evaluated to determine suitable APD parameters.

The APD parameters can be stored, for example, in a codebook of a memory. In certain implementations, the codebook stores not only the parameters for APD correction, but also phase and power tapering suitable for each transmit signal path to establish a particular beam configuration, such as beam angle, beam directivity, and/or beam focus.

In certain implementations, the APD parameters are used to make the linearity responses on each transmit signal path to an antenna array substantially identical to one another. Thus, coarse linearity correction provided by DPD is applicable to each of the transmit signal paths in the beamforming communication system. The APD adjustments to AM-AM and/or AM-PM responses can be provided over load, power level, and/or other operating conditions, thereby providing a fine adjustment to linearity.

The APD adjustments can be provided in a wide variety of ways, including, but not limited to, adjusting a phase of a phase shifter in a transmit signal path, adjusting a gain of a controllable gain component (for instance, a variable gain amplifier or VGA) in the transmit signal path, adjusting a bias to a power amplifier in the transmit signal path, and/or adjusting a voltage level of a supply voltage of a power amplifier in the transmit signal path.

In certain implementations, DPD parameters are based on observations captured by an observation loop coupled to a particular transmit path of a beamforming communication system. DPD can thus serve to provide pre-distortion that accurately compensates for non-linearity of the transmit path from which the observations were taken. For example, little or no APD can be applied for the transmit path coupled to the observation loop for training DPD. However, due to parametric variation, the DPD parameters may less accurately compensate for non-linearity of other transmit paths of the beamforming communication system. For these transmit paths, DPD can provide a coarse linearity correction and APD can provide a fine linearity correction.

In other implementations, DPD parameters are based off of observations captured from multiple transmit paths of a beamforming communication system. For instance, multiple observation loops can be used and/or a shared observation loop can be selectively connected to different transmit paths over time.

When training DPD using multiple transmit paths, desired DPD parameters or settings can be determined for each path used in the DPD training. However, it may not be feasible to separately control DPD to each transmit path, for instance, in implementations in which RF signals propagating along the system's transmit paths are generated from a common transmit signal. In such implementations, the observations for DPD and/or the DPD parameters derived therefrom can be statistically processed in a desired manner (for instance, averaged) to generate DPD parameters for controlling DPD applied commonly across multiple transmit paths.

In certain implementations, DPD observations are used not only to generate DPD parameters, but also APD parameters. For example, the DPD observations taken from a particular transmit path can be used to generate desired DPD parameters for the transmit path, which in turn can be mapped to corresponding APD parameters for the transmit path. For instance, settings for a parameter table used for APD can be populated based on mapping DPD parameters associated with each path to corresponding APD settings.

Figure 3:
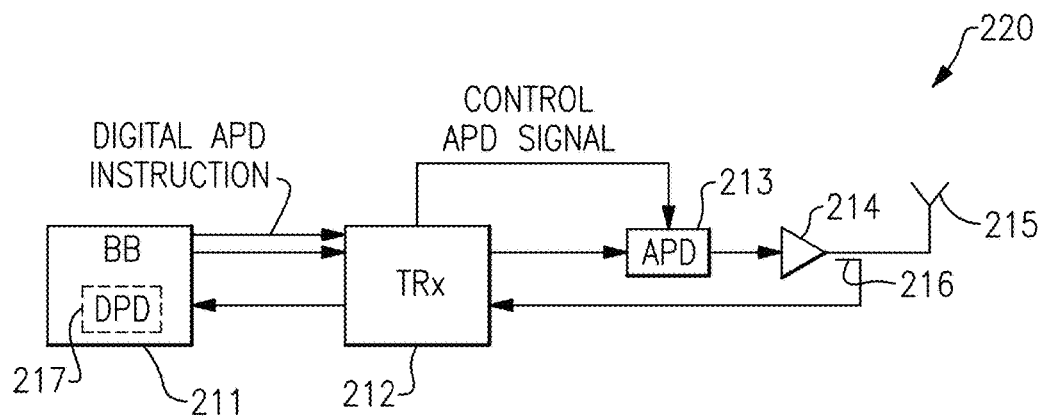
FIG. 3 is a schematic diagram of one embodiment of a communication system operating with pre-distortion for linearization.

FIG. 3 is a schematic diagram of one embodiment of a communication system 220 operating with pre-distortion for linearization. The communication system 220 includes a baseband processor 211, a transceiver 212, an APD circuit 213, a power amplifier 214, an antenna 215, and a directional coupler 216.

Although the communication system 220 illustrates one embodiment of a communication system operating with both DPD and APD, the teachings herein are applicable to communication systems implemented in a wide variety of ways.

In the illustrated embodiment, the baseband processor 211 generates a transmit signal (which can be, for example, a pair of I and Q signals), which is processed by the transceiver 212 to generate an RF input signal. As shown in FIG. 3, the baseband processor 211 includes a DPD circuit 217 for digitally pre-distorting the transmit signal that is provided to the transceiver 212.

With continuing reference to FIG. 3, the baseband processor 211 also provides the transceiver 212 with a digital APD instruction, which is processed by the transceiver 212 to generate an APD control signal for the APD circuit 213.

Although the APD circuit 213 is shown as being coupled to an input of the power amplifier 214 in the transmit signal path, other implementations are possible. For instance, APD can be provided in a wide variety of ways, including, but not limited to, by controlling a phase shift of a phase shifter, controlling a gain of an amplifier, controlling a bias of an amplifier, and/or adjusting a voltage level of a supply voltage of an amplifier.

In the illustrated embodiment, the power amplifier 214 amplifies an RF input signal that is pre-distorted both using the DPD circuit 217 and the APD circuit 213.

With continuing reference to FIG. 3, the RF output signal from the power amplifier 214 is provided to the antenna 215 for wireless transmission. Additionally, the directional coupler 216 operates in an observation loop with an observation channel of the transceiver 212 to provide feedback to the baseband processor 217. For example, in the illustrated embodiment, the directional coupler 216 generates an RF observation signal, which is downconverted by the transceiver 212 to generate observation data for the baseband processor 211. Although one example of an observation loop is shown, the teachings herein are applicable to observation loops implemented in a wide variety of ways. Furthermore, two or more observation loops can be included.

The baseband processor 211 processes the observation data to control the DPD provided by the DPD circuit 217 and/or the digital APD instruction provided to the transceiver 212. Accordingly, feedback is provided so that suitable amounts of DPD and/or APD are provided.

Although one transmit signal path of the communication system 230 is shown for clarity of the figure, the communication system 230 can include multiple transmit signal paths for beamforming. For example, the communication system 230 can represent a portion of a phased array antenna system.

Figure 4A:
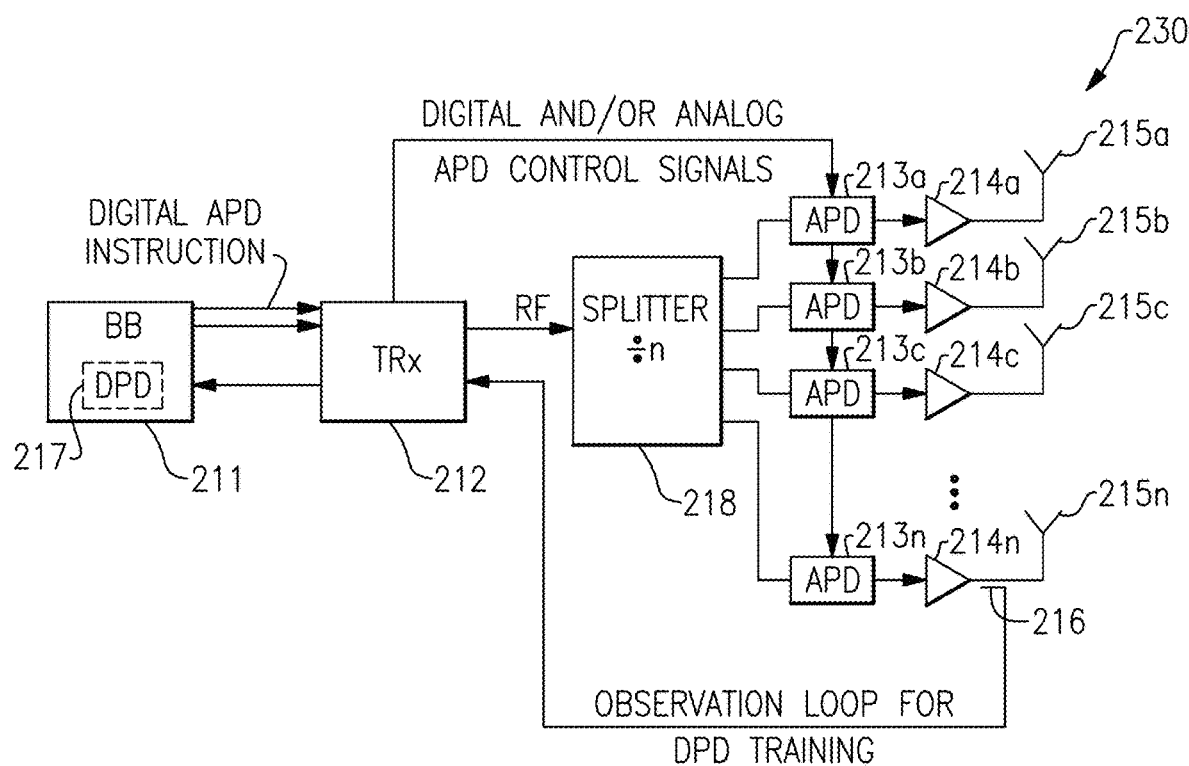
FIG. 4A is a schematic diagram of another embodiment of a communication system operating with pre-distortion for linearization.

FIG. 4A is a schematic diagram of another embodiment of a communication system 230 operating with pre-distortion for linearization. The communication system 230 includes a baseband processor 211, a transceiver 212, APD circuits 213a, 213b, 213c, . . . 213n, power amplifiers 214a, 214b, 214c, . . . 214n, antennas 215a, 215b, 215c, . . . 215n, a directional coupler 216, and an RF splitter 218.

As shown in FIG. 4A, the communication system 230 includes an integer n transmit signal paths. The integer n can be any suitable value, for instance, 2, 3, or 4 or more. A transmit signal path is also referred to herein as an RF signal path to an antenna.

In the illustrated embodiment, an observation loop is provided for one of the transmit signal paths, and serves to provide DPD training to the DPD circuit 217 of the baseband processor 211. In another embodiment, two or more observation loops are included on the same and/or different transmit signal paths.

With continuing reference to FIG. 4A, the baseband processor 211 provides a digital APD instruction to the transceiver 212, which in turn provides digital and/or analog APD controls signals to the APD circuits 213a, 213b, 213c, . . . 213n. Although the APD circuits 213a, 213b, 213c, . . . 213n are illustrated as receiving the APD control signals in a daisy chain arrangement, other implementations are possible. For example, any suitable control signal distribution scheme can be used.

In certain implementations, the DPD circuit 217 provides a coarse adjustment of the pre-distortion to the RF signal for at least a portion of the transmit signal paths. For example, although DPD may provide a highly accurate non-linearity correction (for instance, perfect or near perfect correction) for the transmit signal path from which the DPD observations were taken, parametric variation amongst components of the transmit signal paths (for instance, amongst the power amplifiers 214a, 214b, 214c, . . . 214n) can lead to other transmit signal paths having different amplitude distortion and/or phase distortion characteristics. For such transmit signal paths, the DPD commonly provided across the transmit signal paths can serve to provide a coarse linearity correction, while APD specific to a particular transmit signal path can serve to provide a fine linearity correction.

In one embodiment, a transmit signal path for which DPD is trained omits an APD circuit. For example, with respect to the communication system 230 of FIG. 4A, in certain implementations the APD circuit 213n is omitted.

Since the RF signal is split by the splitter 218, the RF signals of the transmit signal paths operate with common DPD, in this embodiment. Additionally, the APD circuits 213a, 213b, 213c, . . . 213n provide a fine adjustment of the pre-distortion to the RF signals amplified by each of the power amplifiers 214a, 214b, 214c, . . . 214n, respectively.

As shown in FIG. 4A, the power amplifiers 214a, 214b, 214c, . . . 214n provide RF output signals for transmission on antennas 215a, 215b, 215c, . . . 215n, respectively, of an antenna array.

In one embodiment, when operating with the APD parameters, the AM-AM response and/or AM-PM response of each of the transmit signal paths can be substantially identical. Thus, the APD parameters operate to reduce or eliminate differences in AM-AM and/or AM-PM responses.

In another embodiment, the combination of DPD and APD reduces EVM, thereby leading to the communication system 230 generating signal points on a signal constellation that are closely aligned with signal points on an ideal signal constellation.

Figure 4B:
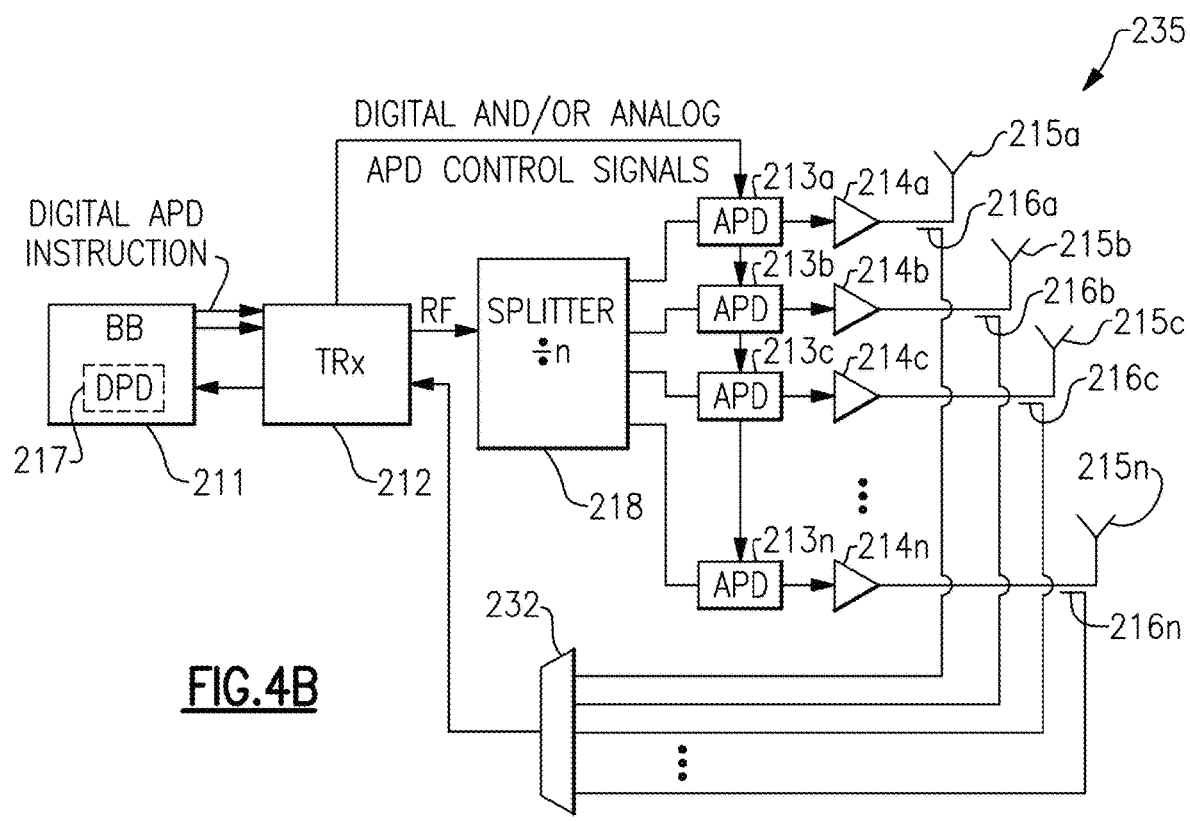
FIG. 4B is a schematic diagram of another embodiment of a communication system operating with pre-distortion for linearization.

FIG. 4B is a schematic diagram of another embodiment of a communication system 235 operating with pre-distortion for linearization. The communication system 235 includes a baseband processor 211, a transceiver 212, APD circuits 213a, 213b, 213c, . . . 213n, power amplifiers 214a, 214b, 214c, . . . 214n, antennas 215a, 215b, 215c, . . . 215n, directional couplers 216a, 216b, 216c, . . . 216n, an RF splitter 218, and a multiplexer 232.

The communication system 235 of FIG. 4B is similar to the communication system 230 of FIG. 4A, except that the communication system 235 includes a directional coupler for each transmit signal path and the multiplexer 232 for selecting which of the transmit signal paths is used as an observation loop for DPD training.

Accordingly, observations are captured from multiple transmit loops and used for DPD training, in this embodiment. For instance, the selected observation loop can be changed over time such that the DPD is based on an average or other desired statistical function of DPD observations and/or DPD settings.

Additionally or alternatively, DPD observations for a particular path can be used to generate DPD parameters that can be used to map or compute corresponding APD parameters for the path. For example, implementing the communication system 235 in this manner can serve to efficiently generate settings (for instance, to populate a parameter table) for each of the APD circuits 213a, 213b, 213c, . . . 213n.

Figure 4C:
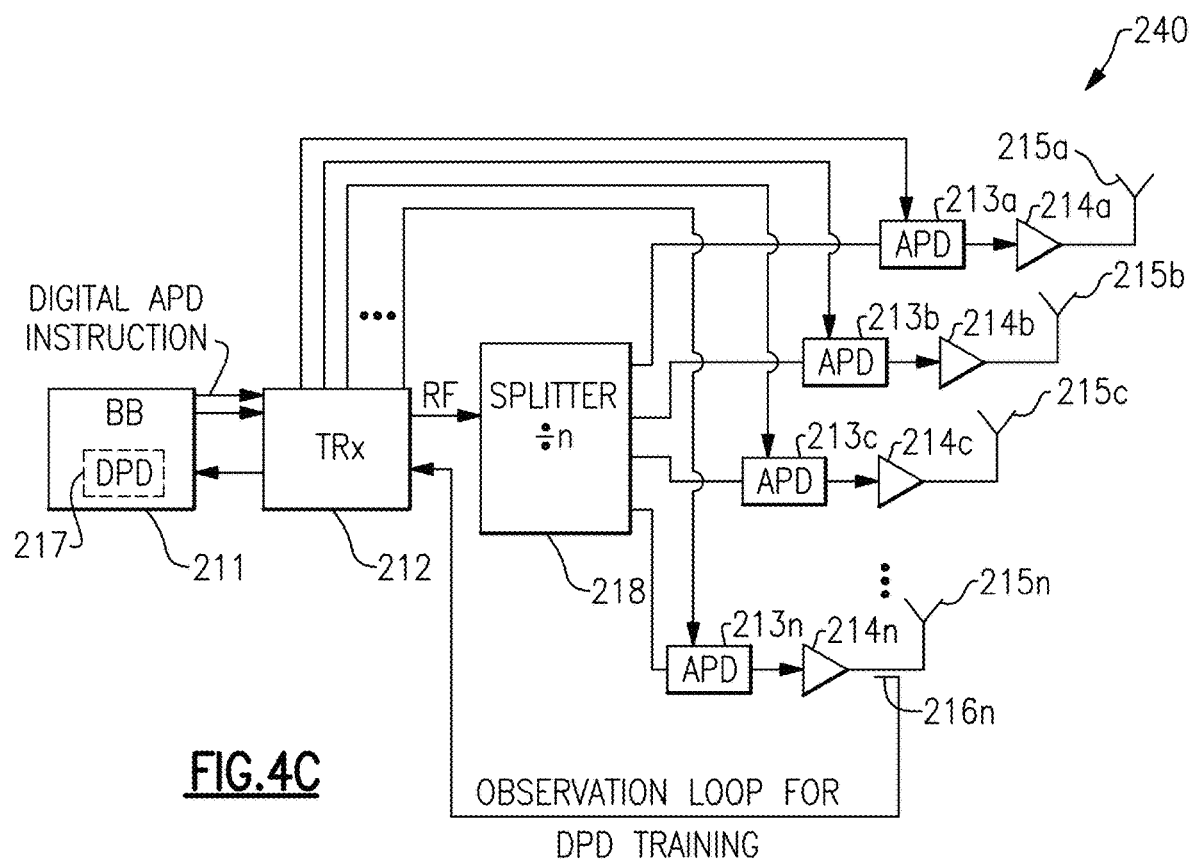
FIG. 4C is a schematic diagram of another embodiment of a communication system operating with pre-distortion for linearization.

FIG. 4C is a schematic diagram of another embodiment of a communication system 240 operating with pre-distortion for linearization. The communication system 240 includes a baseband processor 211, a transceiver 212, APD circuits 213a, 213b, 213c, . . . 213n, power amplifiers 214a, 214b, 214c, . . . 214n, antennas 215a, 215b, 215c, . . . 215n, a directional coupler 216, and an RF splitter 218.

The communication system 240 of FIG. 4C is similar to the communication system 230 of FIG. 4A, except that the communication system 240 illustrates an embodiment in which the transceiver 212 provides settings for APD using a parallel interface rather than a serial or daisy-chained arrangement.

Figure 5:
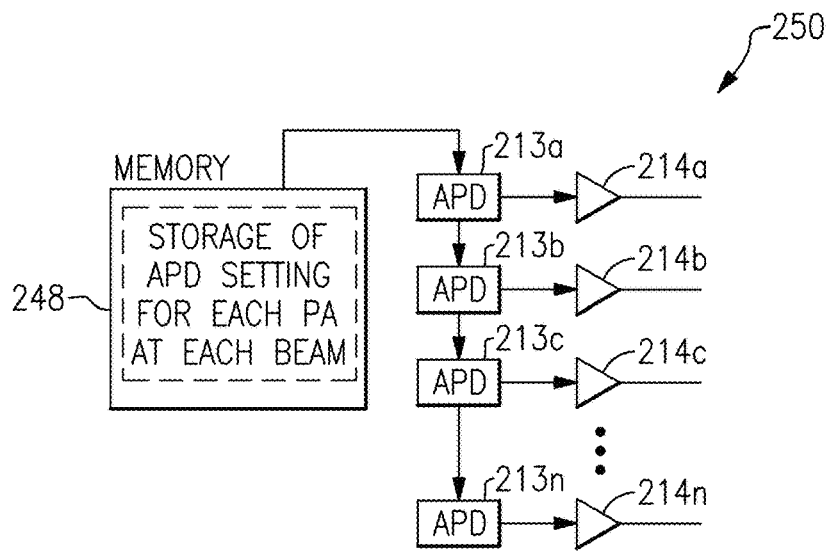
FIG. 5 is a schematic diagram of one embodiment of a front end system with analog pre-distortion (APD) circuitry.

FIG. 5 is a schematic diagram of one embodiment of a front end system 250 with APD circuitry. The front end system 250 includes APD circuits 213a, 213b, 213c, . . . 213n, power amplifiers 214a, 214b, 214c, . . . 214n, and a memory 248.

In the illustrated embodiment, the front end system 250 includes an integer n transmit signal paths, where the integer n can be any suitable number, for instance, 2 or more.

As shown in FIG. 5, the APD parameters of the APD circuits 213a, 213b, 213c, . . . 213n are generated based on a codebook in a memory 248, which can be, for instance, a non-volatile memory. For example, in certain implementations, the front end system 250 is fabricated on a semiconductor die that includes the codebook stored in a non-volatile memory of the die. In certain implementations, the codebook stores not only the parameters for APD correction, but also phase and power tapering suitable for each transmit signal path to establish a particular beam configuration, such as beam angle, beam directivity, and/or beam focus.

The APD parameters can be generated in a wide variety of ways, including, but not limited to, testing prior to usage of the front end system 250 in the context of normal beam transmission.

In one example, each transmit signal path of the front end system 250 is tested after manufacture of the front end system 250. For instance, each transmit signal path can be exercised independently to measure AM-AM and AM-PM responses over a variety of operating conditions, including, but not limited to, load and/or power. Additionally, each response can be compared to generate or set APD parameters for the memory 248. When operating with the APD parameters, the AM-AM response and/or AM-PM response of each of the transmit signal paths can be substantially identical. Thus, the APD parameters operate to reduce or eliminate differences in AM-AM and/or AM-PM responses, in this example.

Although one example of generating APD parameters has been described above, a wide range of techniques and/or methods can be used to determine APD parameters. For instance, in another example, holistic testing is used in which one or more transmit beams are formed and evaluated to determine suitable APD parameters.

Figure 6A:
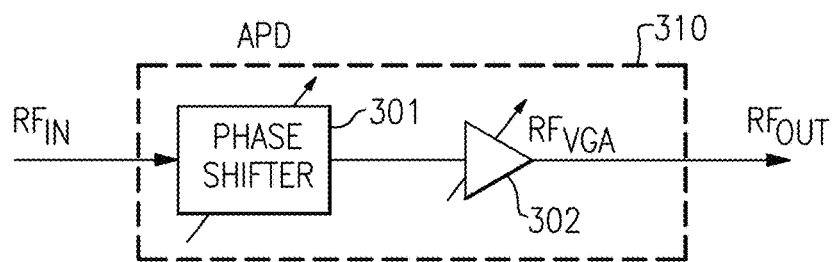
FIG. 6A is a schematic diagram of one embodiment of an APD circuit for a transmit signal path.

FIG. 6A is a schematic diagram of one embodiment of an APD circuit 310 for a transmit signal path. The APD circuit 310 includes a phase shifter 301 and a variable gain amplifier (VGA) 302. As shown in FIG. 6A, an RF input signal ($RF_{IN}$) propagates along a transmit signal path through the APD circuit 310 to generate an RF output signal ($RF_{OUT}$).

In certain implementations, the phase shifter 301 and the VGA 302 are used in a transmit signal path of a beamforming communication system for beamforming. For example, the phase shifter 301 and the VGA 302 can be controlled to provide a desired amplitude and phase for an RF signal provided to a particular antenna of an antenna array.

In the illustrated embodiment, the phase shifter 301 and the VGA 302 are used to provide not only beam settings for the transmit signal path, but also to provide APD. For example, phase adjustment and/or gain adjustment for APD can be overlaid (for instance, added to) the phase and/or gain settings for beam formation.

By implementing the APD circuit 310 in this manner, efficient implementation of APD is provided. For example, sharing components for both beamforming and APD can lead to a compact and/or low cost solution.

Figure 6B:
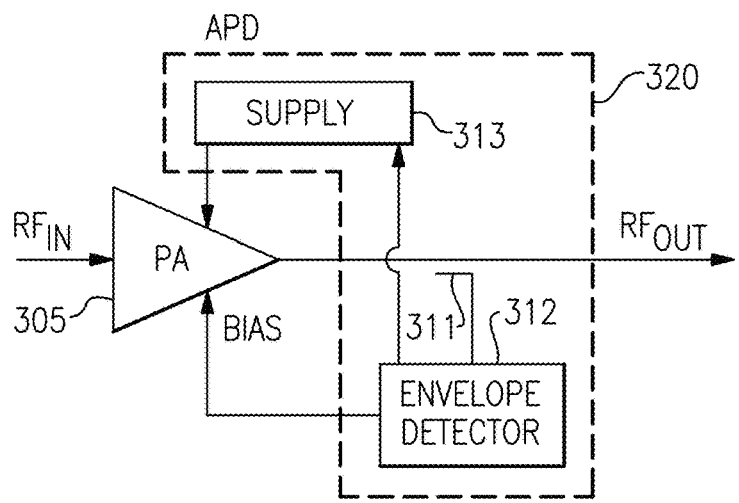
FIG. 6B is a schematic diagram of another embodiment of an APD circuit for a transmit signal path.

FIG. 6B is a schematic diagram of another embodiment of an APD circuit 320 for a transmit signal path. As shown in FIG. 6B, the APD circuit 320 includes a directional coupler 311, an envelope detector 312, and a supply control circuit 313. The APD circuit 320 provides an adjustment to a voltage level of a supply voltage of a power amplifier 305 to thereby provide APD. As shown in FIG. 6B, the power amplifier receives an RF input signal ($RF_{IN}$) and outputs an RF output signal ($RF_{OUT}$).

In the illustrated embodiment, the directional coupler 311 generates an RF observation signal by sensing the RF output signal from the power amplifier 305. Additionally, the envelope detector 312 processes the RF observation signal to generate an envelope signal indicating an envelope of the RF output signal. The supply control circuit 313 adjusts the voltage level of the supply voltage of the power amplifier 305 based on the envelope signal to thereby provide an APD adjustment.

Although FIGS. 6A and 6B illustrate various examples of APD circuits, the teachings herein are applicable to APD circuits implemented in a wide variety of ways. Accordingly, other implementations are possible.

Figure 7:
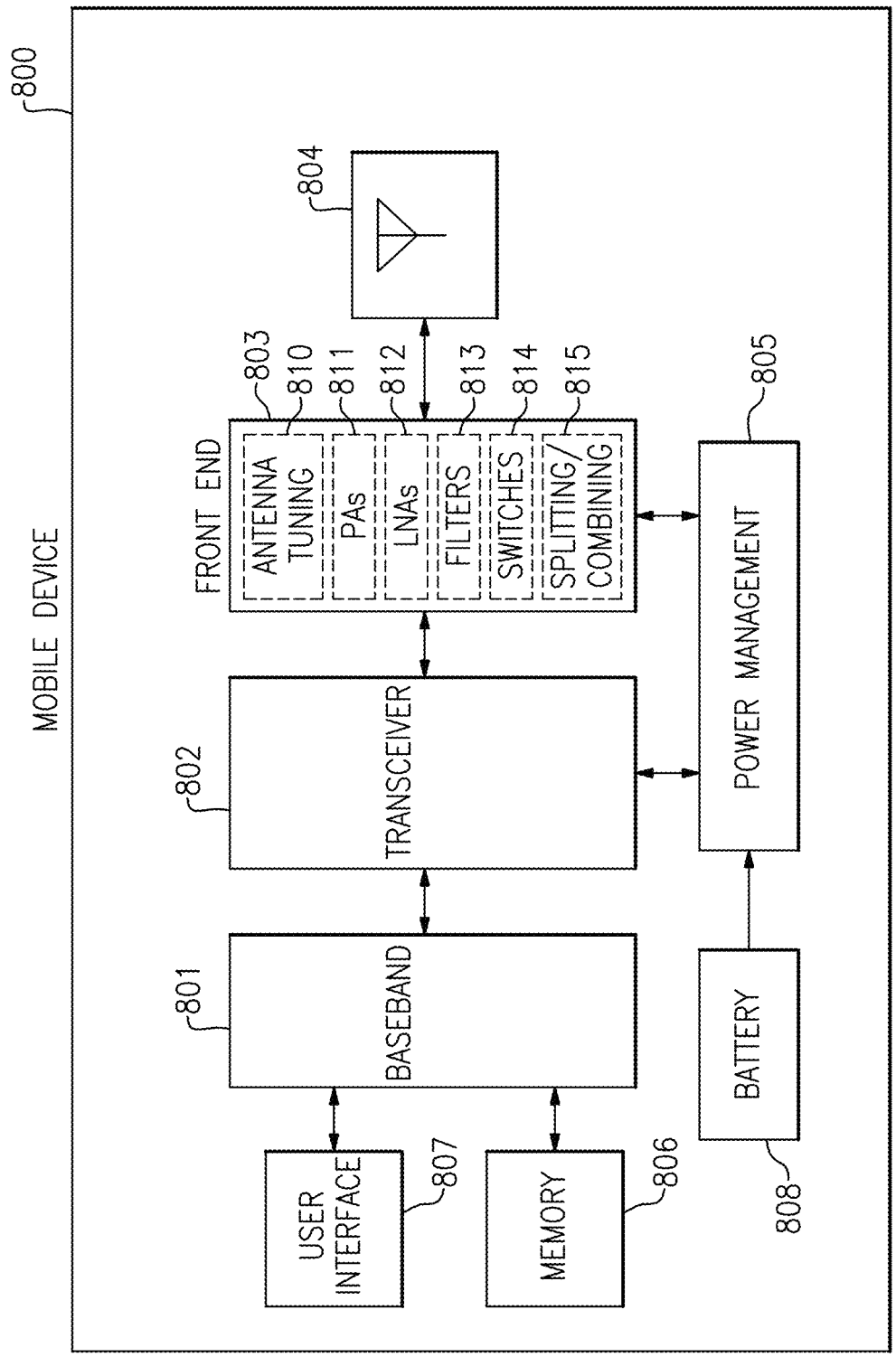
FIG. 7 is a schematic diagram of one embodiment of a mobile device.

FIG. 7 is a schematic diagram of one embodiment of a mobile device 800. The mobile device 800 includes a baseband processor 801, a transceiver 802, a front end system 803, antennas 804, a power management system 805, a memory 806, a user interface 807, and a battery 808. The mobile device 800 can be implemented in accordance with any of the embodiments herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband processor 801 is coupled to the user interface 807 to facilitate processing of various user input and output (I/O), such as voice and data. The baseband processor 801 provides the transceiver 802 with digital representations of transmit signals, which the transceiver 802 processes to generate RF signals for transmission. The baseband processor 801 also processes digital representations of received signals provided by the transceiver 802. As shown in FIG. 7, the baseband processor 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery 808 can be any suitable battery for use in the mobile device 800, including, for example, a lithium-ion battery.

Figure 8:
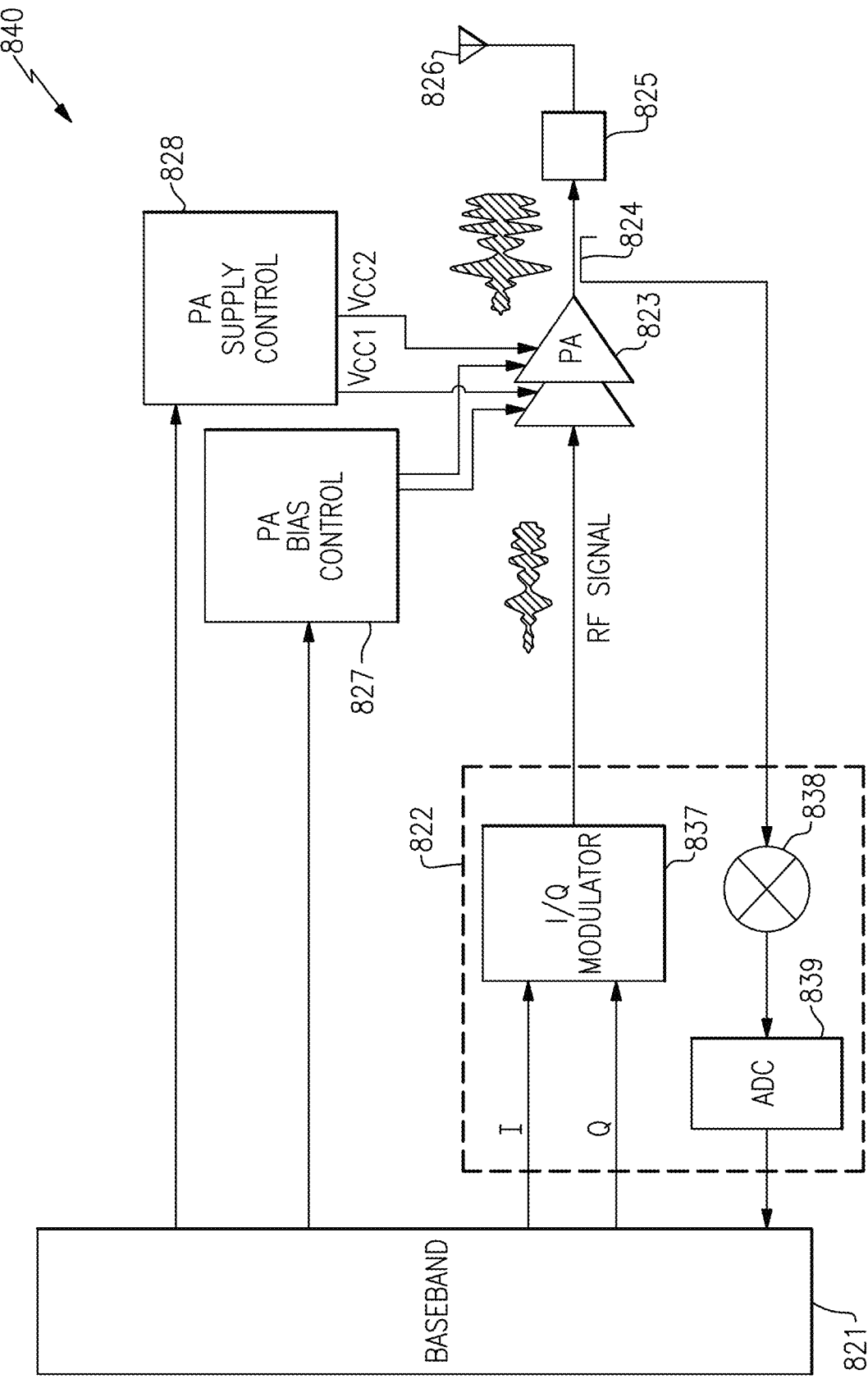
FIG. 8 is a schematic diagram of a power amplifier system according to one embodiment.

FIG. 8 is a schematic diagram of a power amplifier system 840 according to one embodiment. The illustrated power amplifier system 840 includes a baseband processor 821, a transmitter 822, a power amplifier (PA) 823, a directional coupler 824, front-end circuitry 825, an antenna 826, a PA bias control circuit 827, and a PA supply control circuit 828. The illustrated transmitter 822 includes an I/Q modulator 837, a mixer 838, and an analog-to-digital converter (ADC) 839. In certain implementations, the transmitter 822 is included in a transceiver such that both transmit and receive functionality is provided. The power amplifier system 840 can be implemented in accordance with any of the embodiments herein.

The baseband processor 821 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 837 in a digital format. The baseband processor 821 can be any suitable processor configured to process a baseband signal. For instance, the baseband processor 821 can include a digital signal processor, a microprocessor, a programmable core, or any combination thereof. Moreover, in some implementations, two or more baseband processors 821 can be included in the power amplifier system 840.

The I/Q modulator 837 can be configured to receive the I and Q signals from the baseband processor 821 and to process the I and Q signals to generate an RF signal. For example, the I/Q modulator 837 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 823. In certain implementations, the I/Q modulator 837 can include one or more filters configured to filter frequency content of signals processed therein.

The power amplifier 823 can receive the RF signal from the I/Q modulator 837, and when enabled can provide an amplified RF signal to the antenna 826 via the front-end circuitry 825.

The front-end circuitry 825 can be implemented in a wide variety of ways. In one example, the front-end circuitry 825 includes one or more switches, filters, duplexers, multiplexers, and/or other components. In another example, the front-end circuitry 825 is omitted in favor of the power amplifier 823 providing the amplified RF signal directly to the antenna 826.

The directional coupler 824 senses an output signal of the power amplifier 823. Additionally, the sensed output signal from the directional coupler 824 is provided to the mixer 838, which multiplies the sensed output signal by a reference signal of a controlled frequency. The mixer 838 operates to generate a downshifted signal by downshifting the sensed output signal's frequency content. The downshifted signal can be provided to the ADC 839, which can convert the downshifted signal to a digital format suitable for processing by the baseband processor 821. Including a feedback path from the output of the power amplifier 823 to the baseband processor 821 can provide a number of advantages. For example, implementing the baseband processor 821 in this manner can aid in providing power control, compensating for transmitter impairments, and/or in performing digital pre-distortion (DPD). Although one example of a sensing path for a power amplifier is shown, other implementations are possible.

The PA supply control circuit 828 receives a power control signal from the baseband processor 821, and controls supply voltages of the power amplifier 823. In the illustrated configuration, the PA supply control circuit 828 generates a first supply voltage $V_{CC1}$ for powering an input stage of the power amplifier 823 and a second supply voltage $V_{CC2}$ for powering an output stage of the power amplifier 823. The PA supply control circuit 828 can control the voltage level of the first supply voltage $V_{CC1}$ and/or the second supply voltage $V_{CC2}$ to enhance the power amplifier system's PAE.

The PA supply control circuit 828 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 828 is a multi-mode supply control circuit that can operate in multiple supply control modes including an APT mode and an ET mode. For example, the power control signal from the baseband processor 821 can instruct the PA supply control circuit 828 to operate in a particular supply control mode.

As shown in FIG. 8, the PA bias control circuit 827 receives a bias control signal from the baseband processor 821, and generates bias control signals for the power amplifier 823. In the illustrated configuration, the bias control circuit 827 generates bias control signals for both an input stage of the power amplifier 823 and an output stage of the power amplifier 823. However, other implementations are possible.

Figure 9A:
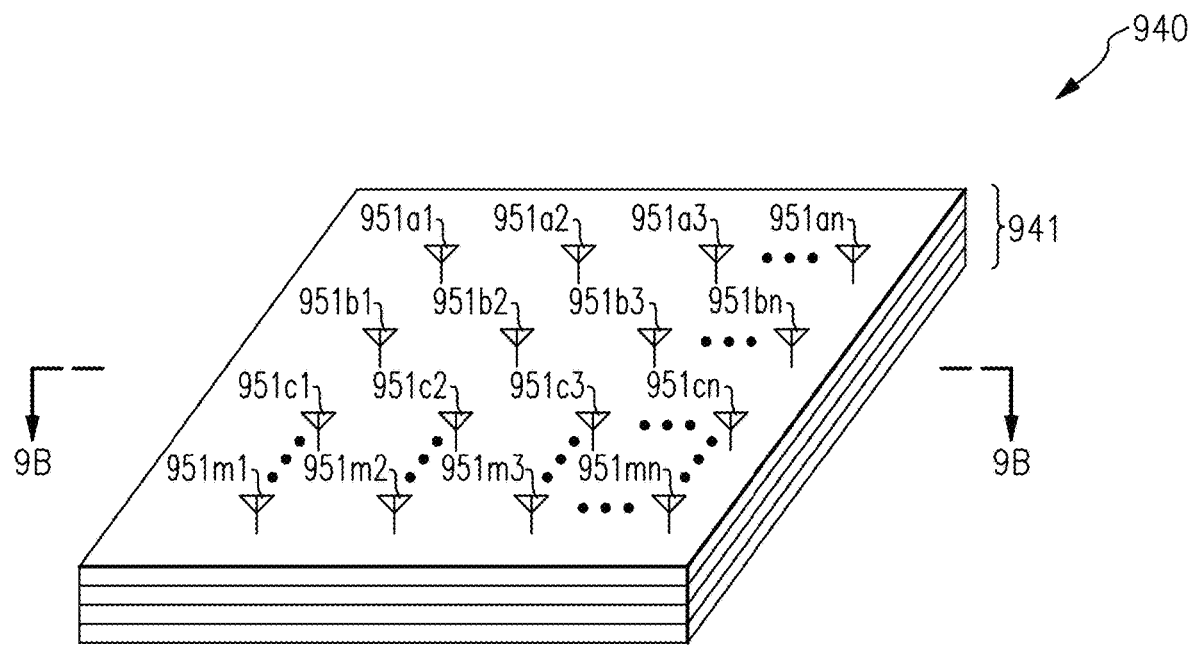
FIG. 9A is a perspective view of one embodiment of a module that operates with beamforming.
Figure 9B:
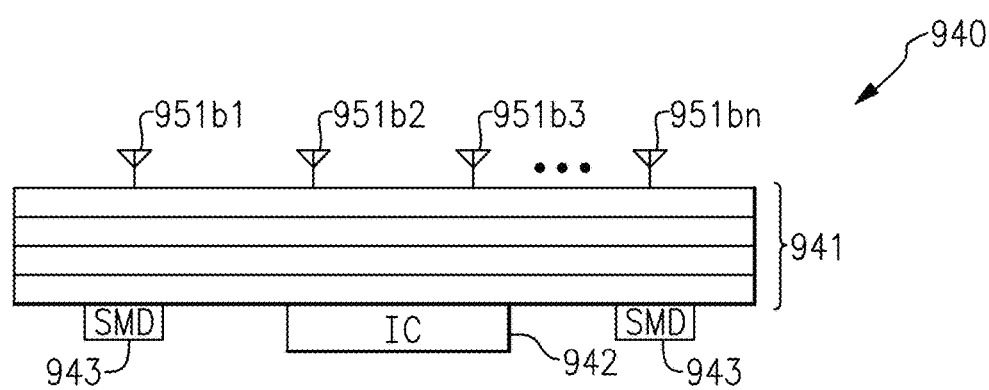
FIG. 9B is a cross-section of the module of FIG. 9A taken along the lines 9B-9B.

FIG. 9A is a perspective view of one embodiment of a module 940 that operates with beamforming. FIG. 9B is a cross-section of the module 940 of FIG. 9A taken along the lines 9B-9B. The module 940 can be implemented in accordance with any of the embodiments herein.

The module 940 includes a laminated substrate or laminate 941, a semiconductor die or IC 942 (not visible in FIG. 9A), surface mount devices (SMDs) 943 (not visible in FIG. 9A), and an antenna array including antenna elements 951a1, 951a2, 951a3 951an, 951b1, 951b2, 951b3 . . . 951bn, 951c1, 951c2, 951c3 951cn, 951m1, 951m2, 951m3 951mn.

Although one embodiment of a module is shown in FIGS. 9A and 9B, the teachings herein are applicable to modules implemented in a wide variety of ways. For example, a module can include a different arrangement of and/or number of antenna elements, dies, and/or surface mount devices. Additionally, the module 940 can include additional structures and components including, but not limited to, encapsulation structures, shielding structures, and/or wirebonds.

The antenna elements antenna elements 951a1, 951a2, 951a3 951an, 951b1, 951b2, 951b3 . . . 951bn, 951c1, 951c2, 951c3 951cn, 951m1, 951m2, 951m3 951mn are formed on a first surface of the laminate 941, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive and/or for different communication bands.

In the illustrated embodiment, the IC 942 is on a second surface of the laminate 941 opposite the first surface. However, other implementations are possible. In one example, the IC 942 is integrated internally to the laminate 941.

In certain implementations, the IC 942 includes signal conditioning circuits associated with the antenna elements 951a1, 951a2, 951a3 951an, 951b1, 951b2, 951b3 951bn, 951c1, 951c2, 951c3 951cn, 951m1, 951m2, 951m3 951mn. In one embodiment, the IC 942 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 942 includes signal conditioning circuits associated with the antenna elements 951a1, 951a2, 951a3 951an, 951b1, 951b2, 951b3 . . . 951bn, 951c1, 951c2, 951c3 951cn, 951m1, 951m2, 951m3 951mn and an integrated transceiver.

The laminate 941 can include various structures including, for example, conductive layers, dielectric layers, and/or solder masks. The number of layers, layer thicknesses, and materials used to form the layers can be selected based on a wide variety of factors, and can vary with application and/or implementation. The laminate 941 can include vias for providing electrical connections to signal feeds and/or ground feeds of the antenna elements. For example, in certain implementations, vias can aid in providing electrical connections between signal conditioning circuits of the IC 942 and corresponding antenna elements.

The antenna elements 951a1, 951a2, 951a3 951an, 951b1, 951b2, 951b3 . . . 951bn, 951c1, 951c2, 951c3 951cn, 951m1, 951m2, 951m3 951mn can correspond to antenna elements implemented in a wide variety of ways. In one example, the array of antenna elements includes patch antenna element formed from a patterned conductive layer on the first side of the laminate 941, with a ground plane formed using a conductive layer on opposing side of the laminate 941 or internal to the laminate 941. Other examples of antenna elements include, but are not limited to, dipole antenna elements, ceramic resonators, stamped metal antennas, and/or laser direct structuring antennas.

The module 940 can be included a communication system, such as a mobile phone or base station. In one example, the module 940 is attached to a phone board of a mobile phone.

Figure 10A:
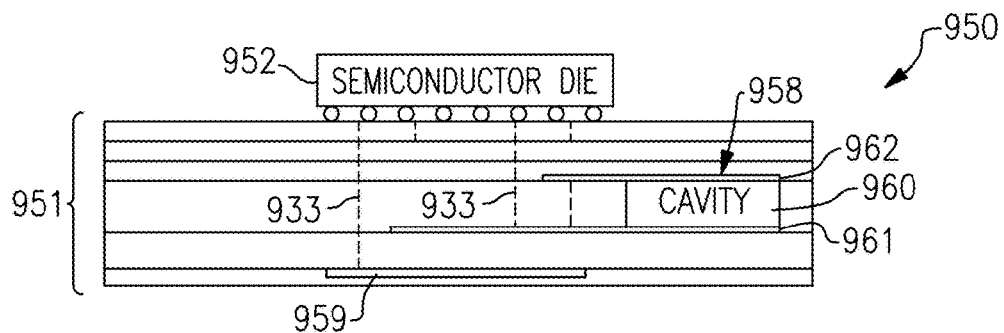
FIG. 10A is a schematic diagram of a cross-section of another embodiment of a packaged module.

FIG. 10A is a schematic diagram of a cross-section of another embodiment of a packaged module 950. The packaged module 950 includes a laminated package substrate 951 and a flip-chip die 952. The packaged module 950 can be implemented in accordance with any of the embodiments herein.

The laminated package substrate 951 includes a cavity-based antenna 958 associated with an air cavity 960, a first conductor 961, a second conductor 962. The laminated package substrate 951 further includes a planar antenna 959.

In certain implementations herein, a packaged module includes one or more integrated antennas. For example, the packaged module 950 of FIG. 10A includes the cavity-based antenna 958 and the planar antenna 959. By including antennas facing in multiple directions (including, but not limited to, directions that are substantially perpendicular to one another), a range of available angles for communications can be increased. Although one example of a packaged module with integrated antennas is shown, the teachings herein are applicable to modules implemented in a wide variety of ways.

Figure 10B:
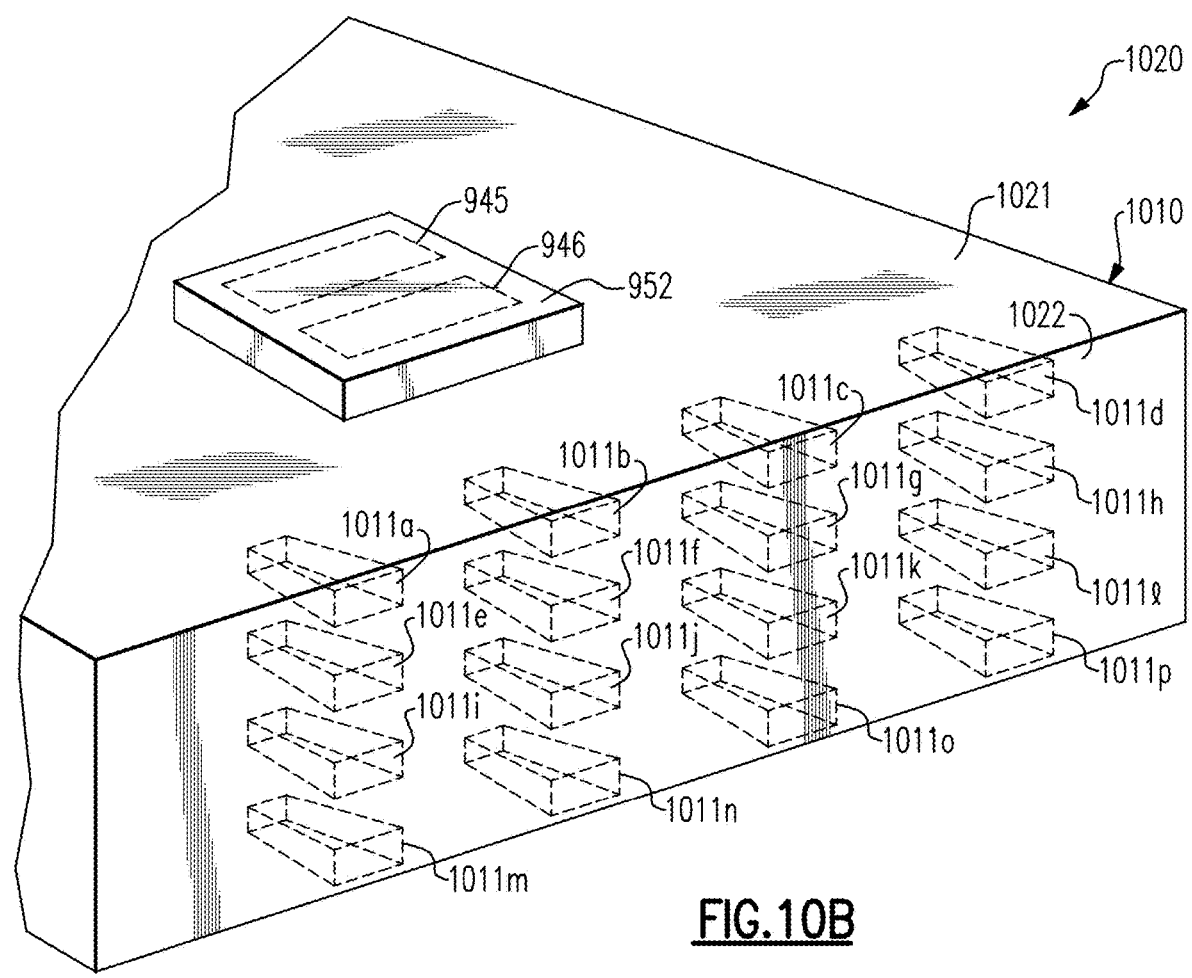
FIG. 10B is a perspective view of another embodiment of a packaged module.

FIG. 10B is a perspective view of another embodiment of a packaged module 1020. The module 1020 includes a laminated substrate 1010 and a semiconductor die 1012. The semiconductor die 1012 includes at least one of a front end system 945 or a transceiver 946. For example, the front end system 945 can include signal conditioning circuits, such as controllable amplifiers and/or controllable phase shifters, to aid in providing beamforming. The packaged module 1020 can be implemented in accordance with any of the embodiments herein.

In the illustrated the embodiment, cavity-based antennas 1011a-1011p have been formed on an edge 1022 of the laminated substrate 1010. In this example, sixteen cavity-based antennas have been provided in a four-by-four (4×4) array. However, more or fewer antennas can be included and/or antennas can be arrayed in other patterns.

In another embodiment, the laminated substrate 1010 further include another antenna array (for example, a patch antenna array) formed on a second major surface of the laminated substrate 1010 opposite the first major surface 1021. Implementing the module 1020 aids in increasing a range of angles over which the module 1020 can communicate.

The module 1020 illustrates another embodiment of a module including an array of antennas that are controllable to provide beamforming. Implementing an array of antennas on a side of module aids in communicating at certain angles and/or directions that may otherwise be unavailable due to environmental blockage. Although an example with cavity-based antennas is shown, the teachings herein are applicable to implementations using other types of antennas.

Figure 11:
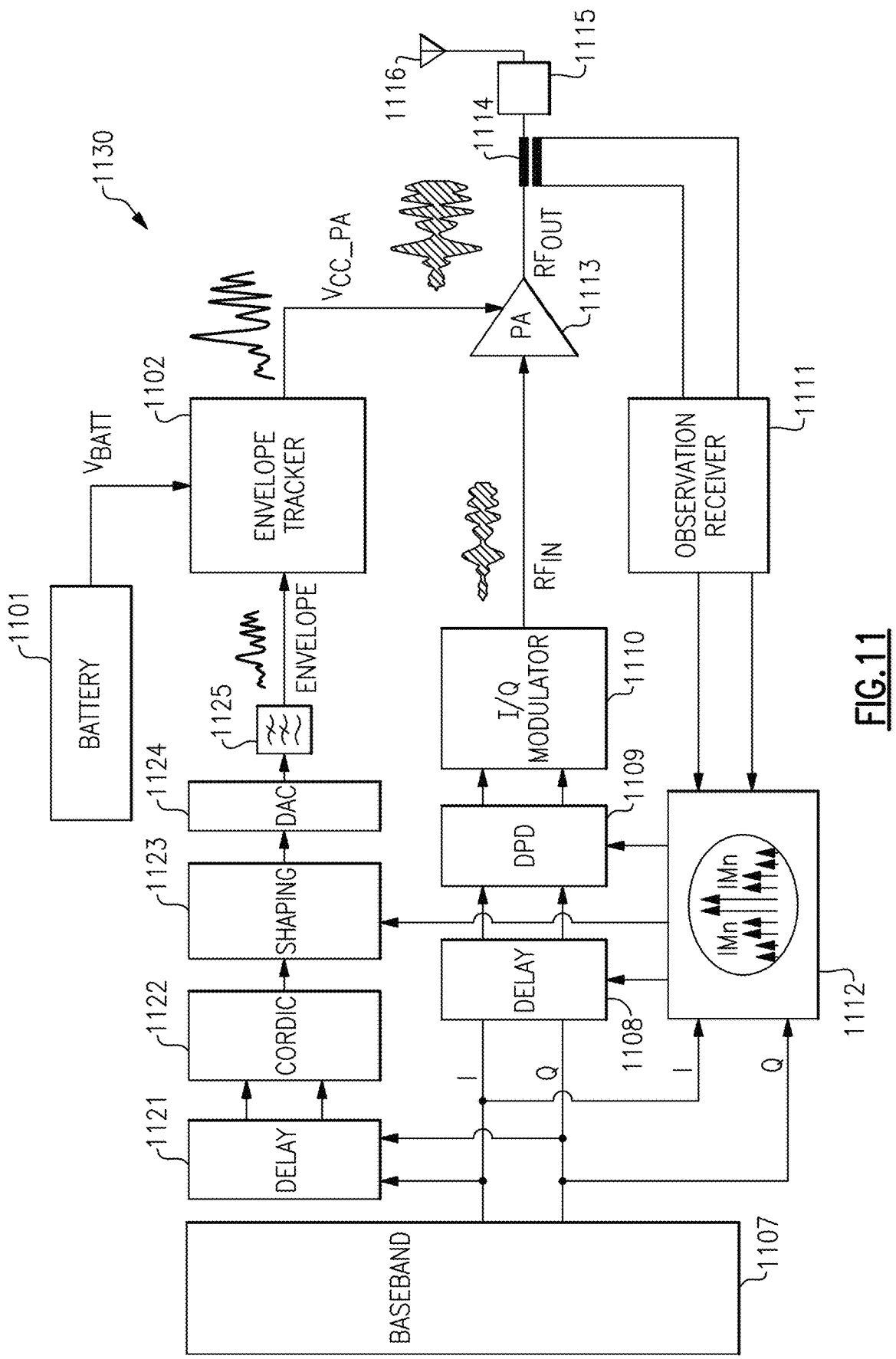
FIG. 11 is a schematic diagram of another embodiment of a communication system for transmitting RF signals.

FIG. 11 is a schematic diagram of another embodiment of a communication system 1130 for transmitting RF signals. The communication system 1130 includes a battery 1101, an envelope tracker 1102, a baseband processor 1107, a signal delay circuit 1108, a digital pre-distortion (DPD) circuit 1109, an I/Q modulator 1110, an observation receiver 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125. The communication system 1130 can be implemented in accordance with any of the embodiments herein.

The communication system 1130 of FIG. 11 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 11 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the envelope tracker 1102. In certain implementations, the reconstruction filter 1125 includes a low pass filter.

With continuing reference to FIG. 11, the envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the power amplifier 1113 that changes in relation to the envelope of the RF signal $RF_{IN}$. The power amplifier 1113 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the observation receiver 1111, which can include mixers for down converting I and Q signal components of the sensed output signal, and DACs for generating I and Q observation signals from the downconverted signals.

The intermodulation detection circuit 1112 determines an intermodulation product between the I and Q observation signals and the I and Q signals from the baseband processor 1107. Additionally, the intermodulation detection circuit 1112 controls the pre-distortion provided by the DPD circuit 1109 and/or a delay of the signal delay circuit 1108 to control relative alignment between the envelope signal and the RF signal $R_{FIN}$.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although illustrated as a single stage, the power amplifier 1113 can include one or more stages. Furthermore, the teachings herein are applicable to communication systems including multiple power amplifiers. In such implementations, separate envelope trackers can be provided for different power amplifiers and/or one or more shared envelope trackers can be used.

Applications

The principles and advantages of the embodiments described herein can be used for a wide variety of applications.

For example, a beamforming communication system can be included in a wide range of radio frequency electronics including, but not limited to, a base station, a wireless network access point, a mobile phone (for instance, a smartphone), a tablet, a vehicle, a computer, and/or an Internet of things (IoT) device.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
    a baseband processor configured to generate a transmit signal, the baseband processor operable to provide digital pre-distortion to the transmit signal;
    a transceiver configured to generate a radio frequency input signal based on the transmit signal;
    a front end system including a plurality of transmit signal paths operable to process the radio frequency input signal to generate a plurality of radio frequency output signals, the plurality of transmit signal paths including a first transmit signal path configured to process the radio frequency input signal to generate a first radio frequency output signal of the plurality of radio frequency output signals, the front end system configured to provide analog pre-distortion to each of the plurality of transmit signal paths including the first transmit signal path, the analog pre-distortion operable to compensate for differences in distortion responses amongst the plurality of transmit signal paths, the differences in distortion responses including at least one of phase distortion or gain distortion; and
    a first antenna configured to transmit the first radio frequency output signal.

2. The mobile device of claim 1 wherein the digital pre-distortion is operable to provide a first amount of linearity correction and the analog pre-distortion is operable to provide a second amount of linearity correction.

3. The mobile device of claim 2 wherein the first amount of linearity correction is a coarse correction and the second amount of linearity correction is a fine correction.

4. The mobile device of claim 1 wherein the baseband processor is further configured to generate settings for digital pre-distortion based on observation data that is generated based on observations from two or more observation paths corresponding to two or more of the plurality of transmit signal paths.

5. The mobile device of claim 1 wherein an amount of analog pre-distortion provided to each of the plurality of transmit signal paths is separately controlled.

6. The mobile device of claim 5 wherein the front end system includes a memory storing a codebook, the amount of analog pre-distortion provided to each of the plurality of transmit signal paths based on pre-distortion data stored in the codebook.

7. The mobile device of claim 6 wherein the mobile device further comprises an antenna array configured to radiate a transmit beam in response to receiving the plurality of radio frequency output signals, the cookbook further including beam configuration data indicating parameters for a plurality of different transmit beams.

8. The mobile device of claim 5 wherein the amount of analog pre-distortion provided to each of the plurality of transmit signal paths is unique.

9. The mobile device of claim 1 wherein the front end system includes a splitter configured to split the radio frequency input signal into a plurality of radio frequency input signals each provided to a corresponding one of the plurality of transmit signal paths.

10. The mobile device of claim 1 wherein the front end system includes a plurality of power amplifiers each operating in a respective one of the plurality of transmit signal paths, the front end system configured to provide analog pre-distortion based on adjusting a bias of at least one of the plurality of power amplifiers.

11. The mobile device of claim 1 wherein the front end system includes a plurality of power amplifiers each operating in a respective one of the plurality of transmit signal paths, the front end system configured to provide analog pre-distortion based on adjusting a supply voltage of at least one of the plurality of power amplifiers.

12. The mobile device of claim 1 wherein the front end system includes a plurality of phase shifters each operating in a respective one of the plurality of transmit signal paths, the front end system configured to provide analog pre-distortion based on adjusting a phase shift provided by at least one of the plurality of phase shifters.

13. The mobile device of claim 1 wherein the front end system includes a plurality of variable gain amplifiers each operating in a respective one of the plurality of transmit signal paths, the front end system configured to provide analog pre-distortion based on adjusting a gain provided by at least one of the plurality of variable gain amplifiers.

14. A mobile device comprising:
    a baseband processor configured to generate a transmit signal, the baseband processor operable to provide digital pre-distortion to the transmit signal;
    a transceiver configured to generate a radio frequency input signal based on the transmit signal;
    a front end system including a plurality of transmit signal paths operable to process the radio frequency input signal to generate a plurality of radio frequency output signals, the plurality of transmit signal paths including a first transmit signal path configured to process the radio frequency input signal to generate a first radio frequency output signal of the plurality of radio frequency output signals, the front end system configured to provide analog pre-distortion to the first transmit signal path, the baseband processor further configured to generate settings for digital pre-distortion based on observation data that is generated based on observations from two or more observation paths corresponding to two or more of the plurality of transmit signal paths, the observation data generated based on an average of observations from the two or more observation paths; and a first antenna configured to transmit the first radio frequency output signal.

15. The mobile device of claim 14 wherein the front end system is configured to provide analog pre-distortion to each of the plurality of transmit signal paths.

16. The mobile device of claim 14 wherein the digital pre-distortion is operable to provide a first amount of linearity correction and the analog pre-distortion is operable to provide a second amount of linearity correction.

17. A mobile device comprising:
a baseband processor configured to generate a transmit signal, the baseband processor operable to provide digital pre-distortion to the transmit signal;
a transceiver configured to generate a radio frequency input signal based on the transmit signal;
a front end system including a plurality of transmit signal paths operable to process the radio frequency input signal to generate a plurality of radio frequency output signals, the plurality of transmit signal paths including a first transmit signal path configured to process the radio frequency input signal to generate a first radio frequency output signal of the plurality of radio frequency output signals, the front end system configured to provide analog pre-distortion to the first transmit signal path, the baseband processor further configured to generate settings for digital pre-distortion based on observation data that is generated based on observations from two or more observation paths corresponding to two or more of the plurality of transmit signal paths, the front end system further including two or more directional couplers each coupled to a corresponding one of the two or more observation paths, and a multiplexer configured to select one of the two or more directional couplers; and a first antenna configured to transmit the first radio frequency output signal.

18. The mobile device of claim 17 wherein the front end system is configured to provide analog pre-distortion to each of the plurality of transmit signal paths.

19. The mobile device of claim 18 wherein an amount of analog pre-distortion provided to each of the plurality of transmit signal paths is separately controlled.

20. The mobile device of claim 17 wherein the digital pre-distortion is operable to provide a first amount of linearity correction and the analog pre-distortion is operable to provide a second amount of linearity correction.

* * * * *